(12) United States Patent
Yamamoto et al.

(10) Patent No.: US 9,545,036 B2
(45) Date of Patent: Jan. 10, 2017

(54) MOTOR DRIVER AND CABINET

(71) Applicant: FANUC CORPORATION,
Minamitsuru-gun, Yamanashi (JP)

(72) Inventors: Kazuhiro Yamamoto, Minamitsuru-gun (JP); Makoto Takeshita, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 340 days.

(21) Appl. No.: 14/038,101

(22) Filed: Sep. 26, 2013

(65) Prior Publication Data

US 2014/0085820 A1 Mar. 27, 2014

(30) Foreign Application Priority Data

Sep. 27, 2012 (JP) .................................. 2012-214594

(51) Int. Cl.
*H05K 7/20* (2006.01)
(52) U.S. Cl.
CPC .................................. *H05K 7/20909* (2013.01)
(58) Field of Classification Search
CPC ............... H02B 1/26; H02B 1/28; H05K 5/02; H05K 7/209
USPC .................................................. 361/695, 697
See application file for complete search history.

(56) References Cited

U.S. PATENT DOCUMENTS

| 6,024,236 | A * | 2/2000 | Jannot | H02B 1/50 |
| | | | | 174/66 |
| 7,923,670 | B2 * | 4/2011 | Hirano | H05K 7/20172 |
| | | | | 219/757 |
| 2012/0327601 | A1* | 12/2012 | Shintani | H05K 7/20909 |
| | | | | 361/697 |
| 2013/0020329 | A1* | 1/2013 | Lin | H05K 7/186 |
| | | | | 220/367.1 |

FOREIGN PATENT DOCUMENTS

| JP | 295891 U | 7/1990 |
| JP | 4368199 A | 12/1992 |
| JP | 09172281 A | 6/1997 |
| JP | 3072558 U | 10/2000 |
| JP | 2007-048946 A | 2/2007 |
| JP | 2011-93542 A | 5/2011 |

OTHER PUBLICATIONS

Office Action mailed Apr. 1, 2014, corresponds to Japanese patent application No. 2012-214594.
Office Action mailed Apr. 7, 2015, corresponding to Japanese patent application No. 2012-214594.

* cited by examiner

*Primary Examiner* — Tuan T Dinh
*Assistant Examiner* — Mukund G Patel
(74) *Attorney, Agent, or Firm* — Hauptman Ham, LLP

(57) ABSTRACT

Provided is a motor driver including: a housing; an electronic component that is disposed inside the housing, and that drives or controls a motor; and a fan motor that is disposed below a top plate of the housing, and that causes air to pass from an opening in a bottom plate of the housing to an opening in the top plate. In the motor driver, an outer surface of the top plate is an inclined surface.

9 Claims, 21 Drawing Sheets

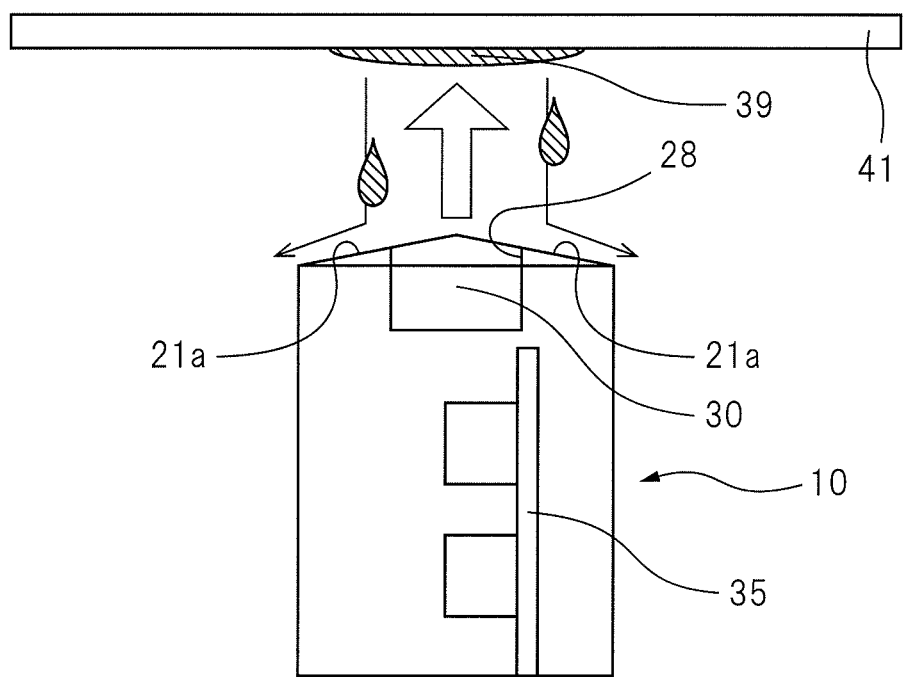

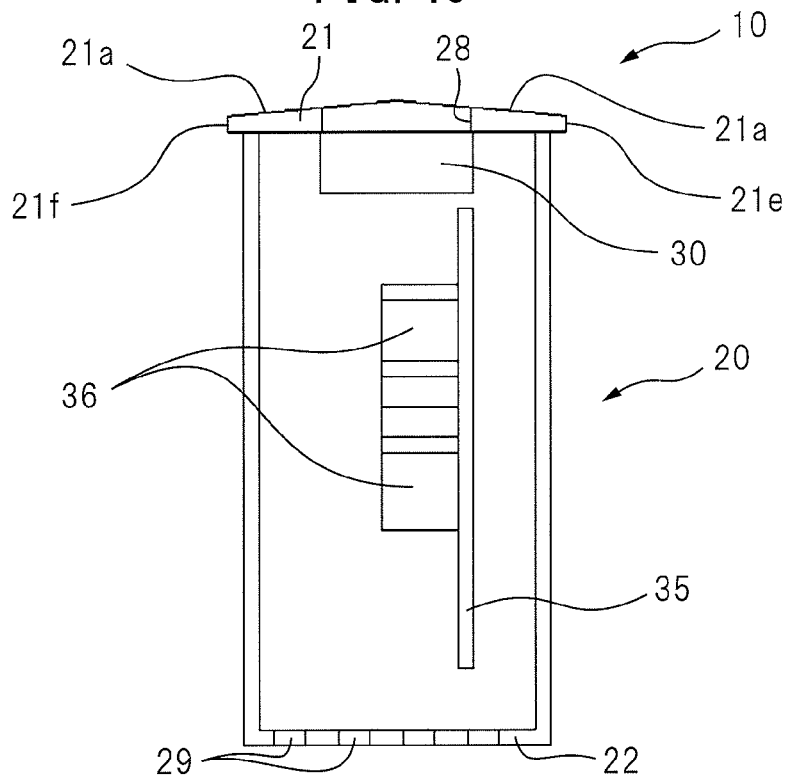
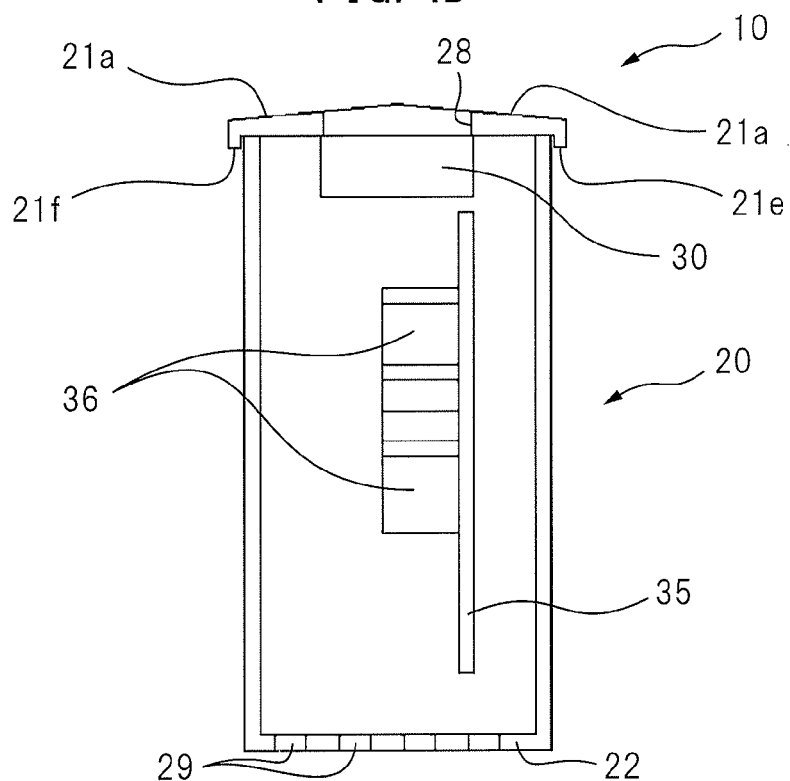

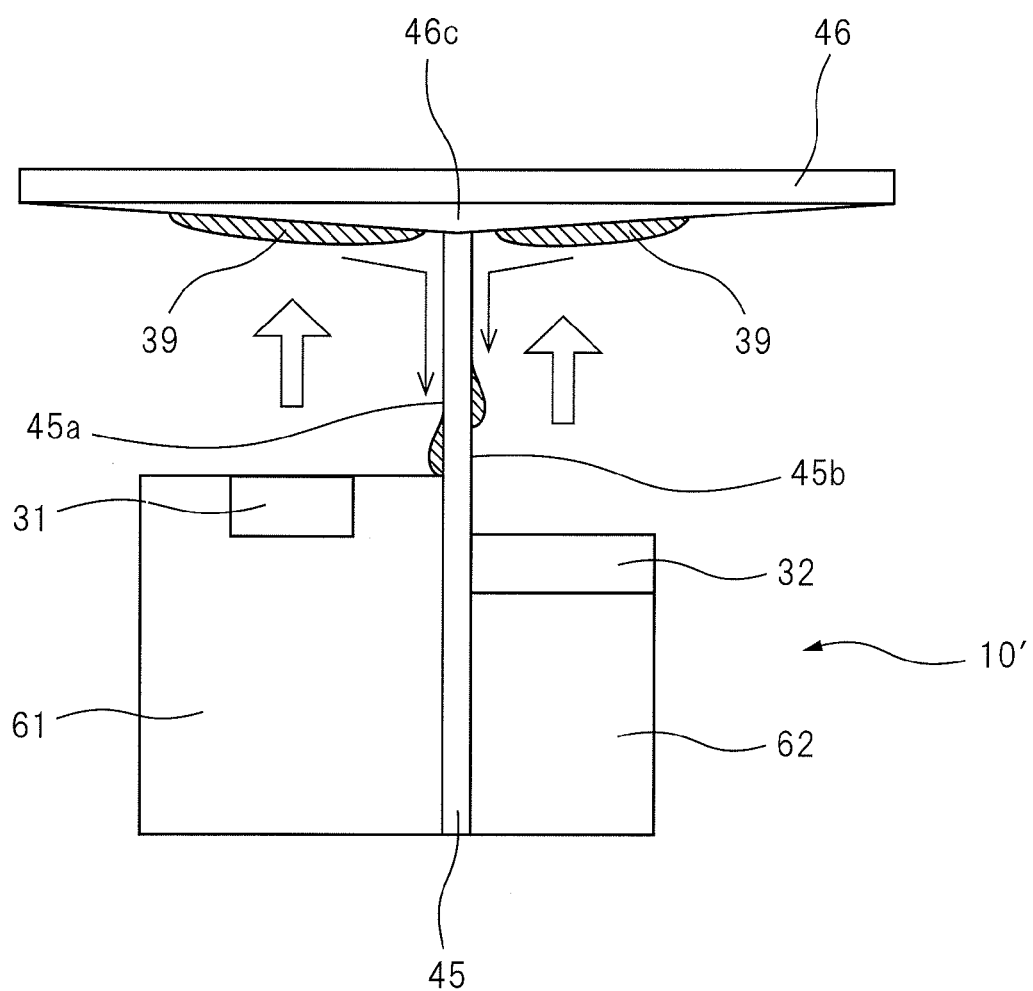

MOTOR DRIVER AND CABINET

RELATED APPLICATIONS

The present application is based on, and claims priority from, Japanese Application Number 2012-214594, filed Sep. 27, 2012, the disclosure of which is hereby incorporated by reference herein in its entirety.

BACKGROUND OF THE INVENTION

1. Field of the Invention

The present invention relates to a motor driver including electronic components for driving or controlling a motor, and a cabinet including such electronic components.

2. Description of the Related Art

Some motor drivers mounted inside cabinets are equipped with a fan motor. When the fan motor is in operation, air passes through the inside of the motor driver, thereby cooling the motor driver. However, when the fan motor is in operation, mist of cutting fluid scattered from the machine tool is accumulated at the fan motor, and the cutting fluid consequently adheres to the fan motor, in some cases. The cutting fluid adhering to the fan motor drops, in the form of water drops or oil drops, down to the electronic components positioned below the fan motor in the motor driver, which may cause a breakdown of the electronic components.

To address this problem, in Japanese Patent Application Laid-Open Publication No. H09-172281, a fan motor is attached so as to be inclined with respect to a horizontal plane. Further, in Japanese Patent Application Laid-Open Publication No. 2007-48946, a plane for mounting a fan motor is inclined. Accordingly, in Japanese Patent Application Laid-Open Publication No. H09-172281 and Japanese Patent Application Laid-Open Publication No. 2007-48946, cutting fluid is guided to a certain area where no electronic components are disposed.

In some cases, a laterally-extending wall is disposed above a motor driver. In such a case, mist of cutting fluid sprayed from the motor driver onto the wall by a fan motor is accumulated on the wall and thereby forms a fluid pool. When a certain amount of cutting fluid is accumulated, the cutting fluid drops from the wall down to the motor driver under its own weight. Then, the cutting fluid flows into the motor driver through a gap at a top plate of the motor driver, which may cause a breakdown of the electronic components.

Although fan motors are normally attached to the upper end of a motor driver, some fan motors are attached to an inner part of a motor driver with a distance from the upper end of the motor driver. In such a case, mist of cutting fluid is sprayed onto an inner surface of a top plate of the housing of the motor driver by a fan motor, and accumulated at the inner surface. Then, the cutting fluid thus accumulated drops from the inner surface of the top plate down to the electronic components in the motor driver, which may cause a breakdown of the electronic components as in the above case.

The present invention has been made in view of the above circumstances, and aims to provide a motor driver and a cabinet that are capable of preventing a breakdown of electronic components mounted therein, due to cutting fluid.

SUMMARY OF THE INVENTION

To achieve the above-described aim, a first aspect of the present invention provides a motor driver including: a housing; an electronic component that is disposed inside the housing, and that drives or controls a motor; and a fan motor that is disposed below a top plate of the housing, and that causes air to pass from an opening in a bottom plate of the housing to an opening in the top plate. In the motor driver, an outer surface of the top plate is an inclined surface.

According to a second aspect, in a first aspect, part of the outer surface of the top plate, the part excluding an edge portion of the outer surface of the top plate, i.e., a center portion, is in a higher position than the edge portion.

According to a third aspect, in a first aspect, part of the outer surface of the top plate, the part excluding an edge portion of the outer surface of the top plate, i.e., a center portion, is in a lower position than the edge portion.

According to a fourth aspect, in a first aspect, an edge portion of the outer surface of the top plate is in a higher position than an opposite edge portion of the outer surface of the top plate.

According to a fifth aspect, in a first aspect, the top plate of the housing protrudes laterally so as to be longer than the width of the rest of the housing.

According to a sixth aspect, in any one of the first to fifth aspects, at least one of a groove and an elongated protrusion is provided in at least one of the outer surface of the top plate of the housing and an outer surface of a side plate of the housing.

A seventh aspect provides a motor driver including: a housing; an electronic component that is disposed inside the housing, and that drives or controls a motor; and a fan motor that is disposed below a top plate of the housing, and that causes air to pass from an opening in a bottom plate of the housing to an opening in the top plate. In the motor driver, an inner surface of the top plate is an inclined surface.

According to an eighth aspect, in the seventh aspect, part of the inner surface of the top plate, the part excluding an edge portion of the inner surface of the top plate, i.e., a center portion, is in a higher position than the edge portion.

According to a ninth aspect, in the seventh aspect, part of the inner surface of the top plate, the part excluding an edge portion of the inner surface of the top plate, i.e., a center portion, is in a lower position than the edge portion.

According to a tenth aspect, in the seventh aspect, an edge portion of the inner surface of the top plate is in a higher position than an opposite edge portion of the inner surface of the top plate.

According to an eleventh aspect, in any one of the seventh to tenth aspects, at least one of a groove and an elongated protrusion is provided on an inner surface of a side plate of the housing.

A twelfth aspect provides a cabinet including: a first wall that extends vertically; electronic equipment that is attached to a surface of the first wall, and that drives or controls a motor; and a second wall that is attached to the first wall above the electronic equipment and extends laterally. In the cabinet, a surface of the second wall, the surface facing the electronic equipment, is an inclined surface.

According to a thirteenth aspect, in the twelfth aspect, the cabinet further includes an inverted V-shaped protrusion that is provided in the first wall and is inclined downward from a portion of the first wall, the portion being other than an edge portion of the first wall, i.e., a center portion, to each side portion of the first wall.

According to a fourteenth aspect, in the twelfth aspect, the cabinet further includes an elongated protrusion that is provided in the first wall and is inclined from a side portion of the first wall to an opposite side portion of the first wall.

According to a fifteenth aspect, in any one of the twelfth to fourteenth aspects, the cabinet further includes a cross-sectionally U-shaped member that is provided in the first wall and extends laterally.

The detailed description of the representative embodiments of the present invention illustrated in the accompanied drawings will make further clear the above objects, features, and advantages, as well as other objects, features, and advantages.

BRIEF DESCRIPTION OF THE DRAWINGS

FIG. 10 is a schematic side view of part of the motor driver illustrated in FIG. 1A.

FIG. 4C is a side view of a different motor driver according to the first embodiment of the present invention.

FIG. 4D is a view illustrating a modified example of the motor driver illustrated in FIG. 4C.

FIG. 13A is a schematic side view of part of another cabinet according to the present invention.

DETAILED DESCRIPTION

Figure 1A:
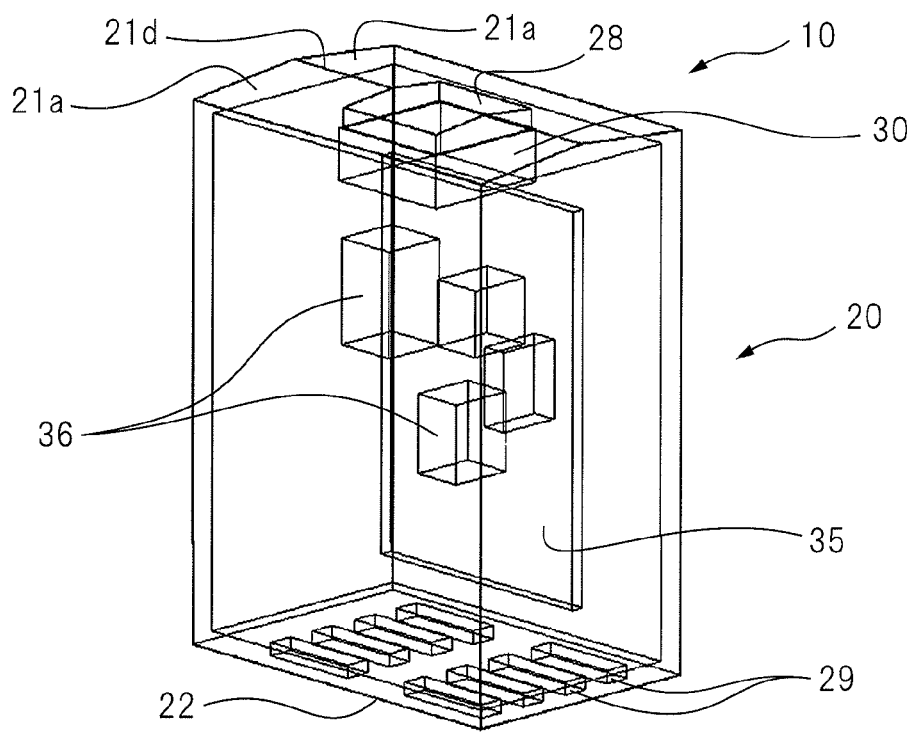
FIG. 1A is a perspective view of a motor driver according to a first embodiment of the present invention.

Embodiments of the present invention will be described below with reference to the accompanying drawings. Throughout the following drawings, the same parts are denoted by the same reference numerals and characters. To make it easier to understand, the drawings vary in scale as appropriate.

Figure 1B:
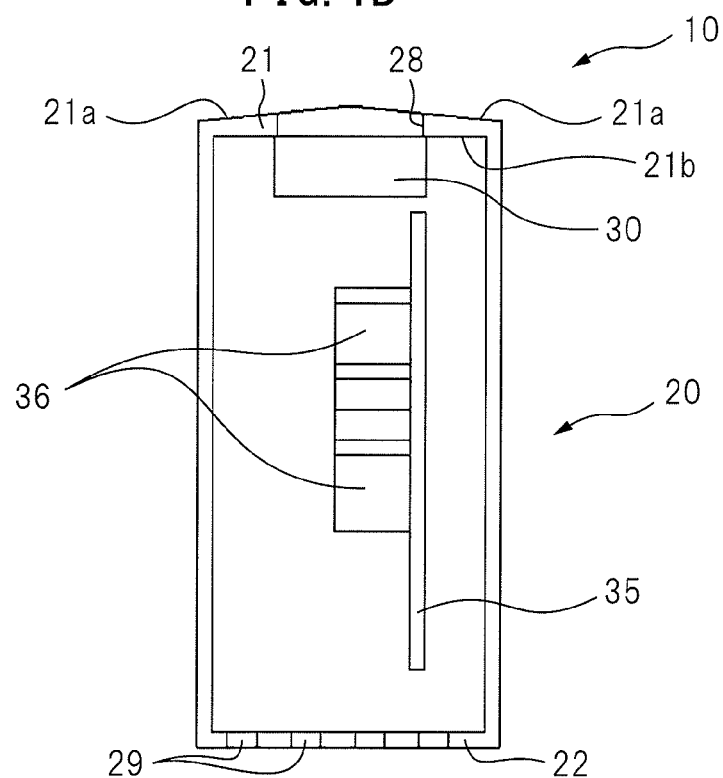
FIG. 1B is a side view of the motor driver illustrated in FIG. 1A.

FIG. 1A is a perspective view of a motor driver according to a first embodiment of the present invention, and FIG. 1B is a side view of the motor driver illustrated in FIG. 1A. It is assumed that a motor driver 10 illustrated in FIGS. 1A and 1B is placed near a machine tool or an industrial robot for cutting a workpiece (not illustrated).

The motor driver 10 mainly includes a housing 20 in a substantially rectangular parallelepiped shape, and a printed circuit board 35 arranged vertically in the housing 20. As illustrated in FIGS. 1A and 1B, a plurality of electronic components 36 for driving or controlling a servo motor for the machine tool or the industrial robot are mounted on the printed circuit board 35.

As can be seen from FIGS. 1A and 1B, a through-hole 28 is formed in a top plate 21 of the housing 20. A fan motor 30 is attached to an inner surface 21b of the top plate 21 so as to be adjacent to the through-hole 28. In addition, a plurality of through-holes 29 are formed in a bottom plate 22 of the housing 20.

With this configuration, when the fan motor 30 is in operation, the outside air flows into the internal space of the housing 20 through the through-holes 29 in the bottom plate 22, and then flows out through the through-hole 28 in the top plate 21. In this way, the electronic components 36 on the printed circuit board 35 can be cooled.

FIG. 10 is a schematic side view of part of the motor driver illustrated in FIG. 1A. As illustrated in FIG. 10, a wall 41, such as a ceiling, extends approximately horizontally, above the motor driver 10. Since the motor driver 10 is placed near a machine tool or an industrial robot as mentioned previously, cutting fluid used for machining exists around the motor driver 10 in the form of cutting fluid mist. As a result, when the fan motor 30 is in operation, the cutting fluid mist comes into the housing 20 through the through-holes 29, and is then discharged from the internal space of the housing 20 through the through-hole 28 as indicated by a white arrow. The cutting fluid mist thus discharged is sprayed onto the wall 41 and then accumulated as a fluid pool 39. When the fluid pool 39 reaches a certain volume, the cutting fluid drops down to the motor driver 10 under its own weight, as indicated by solid-line arrows.

In some examples of the first embodiment of the present invention, an outer surface of the top plate 21 of the housing 20 is configured by two inclined surfaces 21a. As illustrated in FIG. 1A, each of the inclined surfaces 21a is inclined upward toward the center of the housing 20. Accordingly, a line 21d of intersection of the inclined surfaces 21a, which extends in parallel with each side plate of the housing 20, is in a higher position than edge portions of the outer surface of the top plate 21.

In this configuration, even if the cutting fluid sprayed onto the wall 41 positioned above the motor driver 10 drops down to the motor driver 10, the cutting fluid is guided to the outer surfaces of the side surfaces of the housing 20 along the inclined surfaces 21a. This can prevent the cutting fluid from flowing into the motor driver 10, and consequently prevent a breakdown of the electronic components 36 in the motor driver 10, due to the cutting fluid.

Figure 2A:
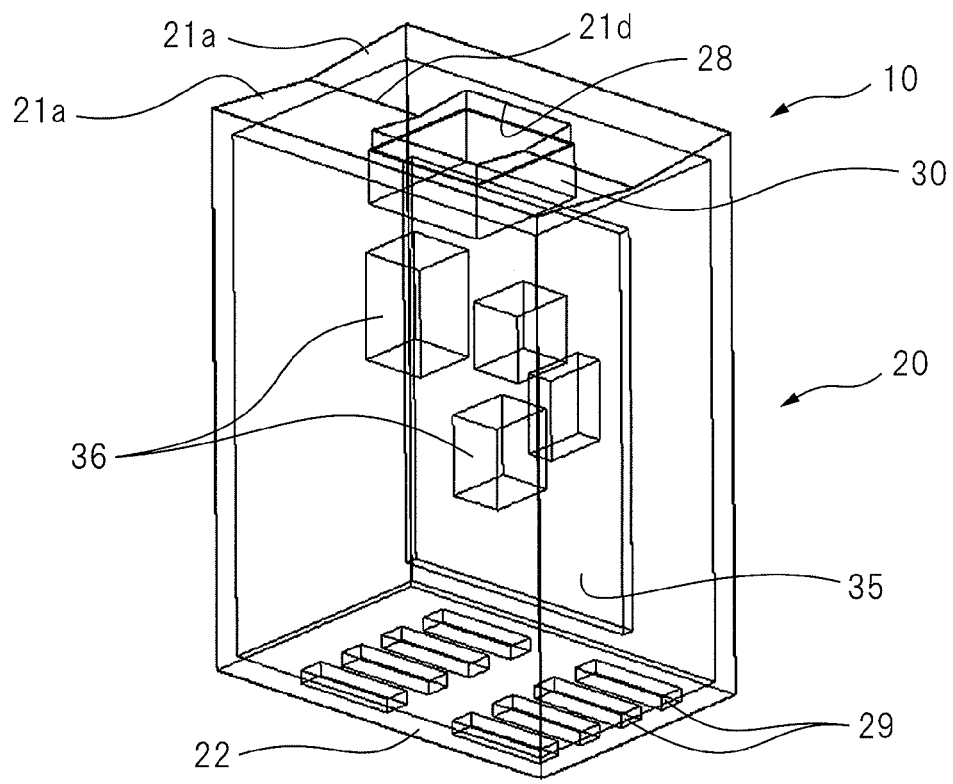
FIG. 2A is a perspective view of another motor driver according to the first embodiment of the present invention.
Figure 2B:
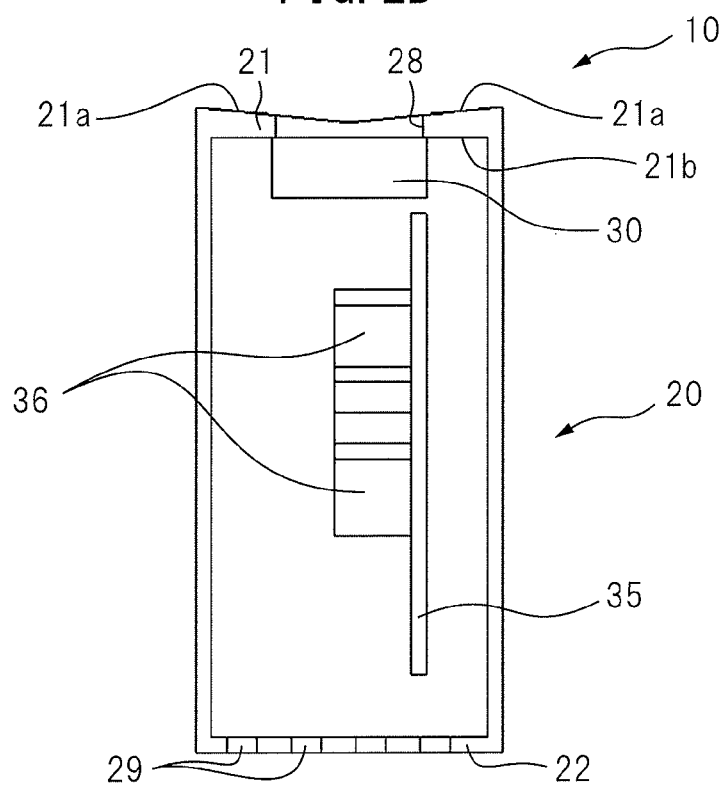
FIG. 2B is a side view of the motor driver illustrated in FIG. 2A.

FIG. 2A is a perspective view of another motor driver according to the first embodiment of the present invention, and FIG. 2B is a side view of the motor driver illustrated in FIG. 2A. In FIGS. 2A and 2B, each of two inclined surfaces 21a of the top plate 21 of the housing 20 is inclined downward toward the center of the housing 20. Accordingly, a line 21d of intersection of the inclined surfaces 21a, which extends in parallel with each side plate of the housing 20, is in a lower position than the edge portions of the outer surface of the top plate 21.

In this configuration, even if cutting fluid sprayed onto the wall 41 (see FIG. 1C) drops down to the motor driver 10, the cutting fluid is guided to an area near the intersection line 21d on the top plate 21 of the housing 20, along the inclined surfaces 21a, and then discharged outside the housing 20. Thus, this configuration can prevent a breakdown of the electronic components 36 in the motor driver 10, due to the cutting fluid. Naturally, the two inclined surfaces 21a may be designed to differ in size so that the intersection line 21d is in a position apart from the electronic components 36.

Figure 3A:
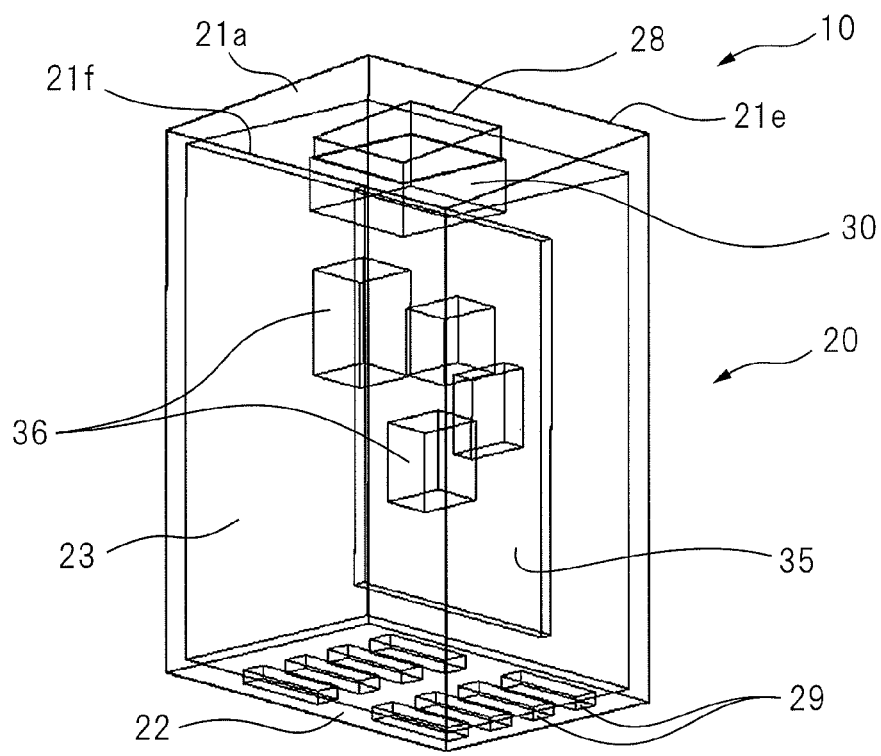
FIG. 3A is a perspective view of still another motor driver according to the first embodiment of the present invention.
Figure 3B:
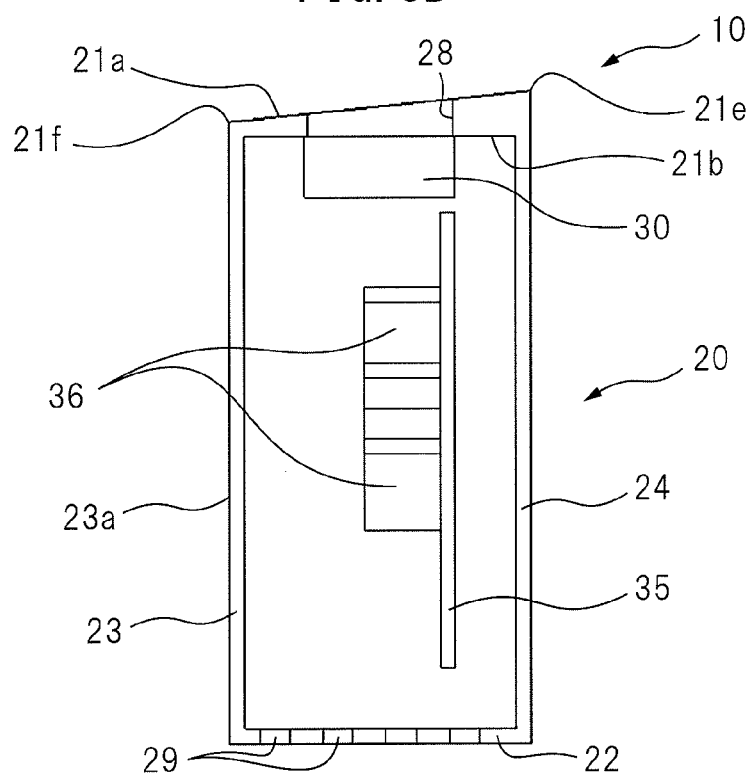
FIG. 3B is a side view of the motor driver illustrated in FIG. 3A.

FIG. 3A is a perspective view of still another motor driver according to the first embodiment of the present invention, and FIG. 3B is a side view of the motor driver illustrated in FIG. 3A. In FIGS. 3A and 3B, the outer surface of the top plate 21 of the housing 20 is configured by a single inclined surface 21a. As can be seen from FIGS. 3A and 3B, an edge portion 21e of the single inclined surface 21a is in a higher position than an opposite edge portion 21f of the single inclined surface 21a.

In this configuration, even if cutting fluid sprayed onto the wall 41 (see FIG. 1C) drops down to the motor driver 10, the cutting fluid is guided to an outer surface 23a of a corresponding side plate 23 of the housing 20 with respect to the top plate 21, along the inclined surface 21a. Thus, it is apparent that this configuration can provide an effect similar to that described above.

Figure 4A:
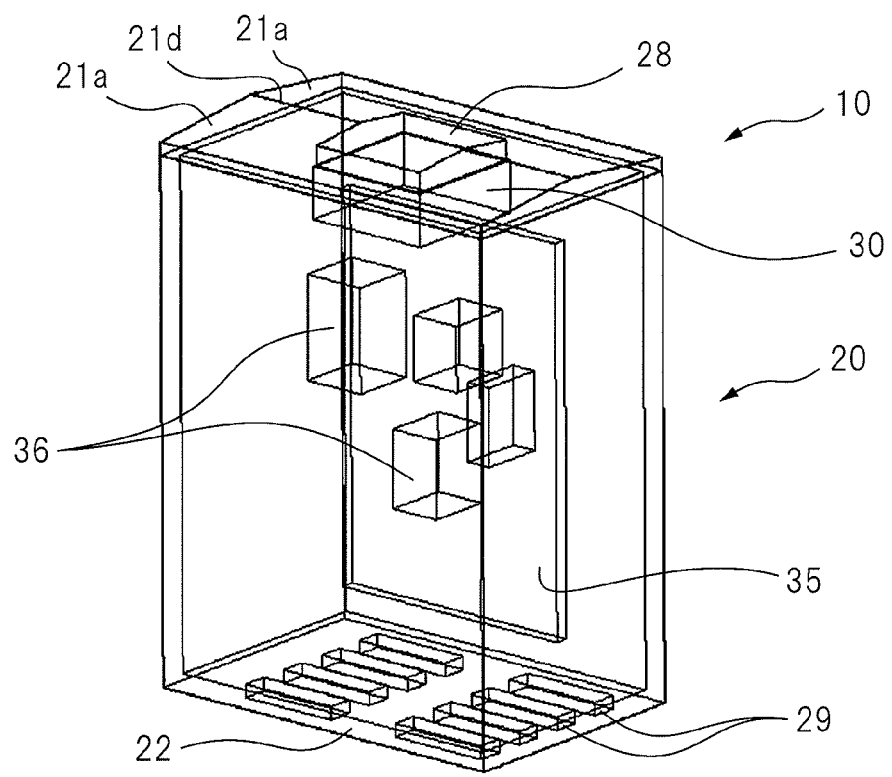
FIG. 4A is a perspective view of a motor driver similar to the one illustrated in FIG. 1A.
Figure 4B:
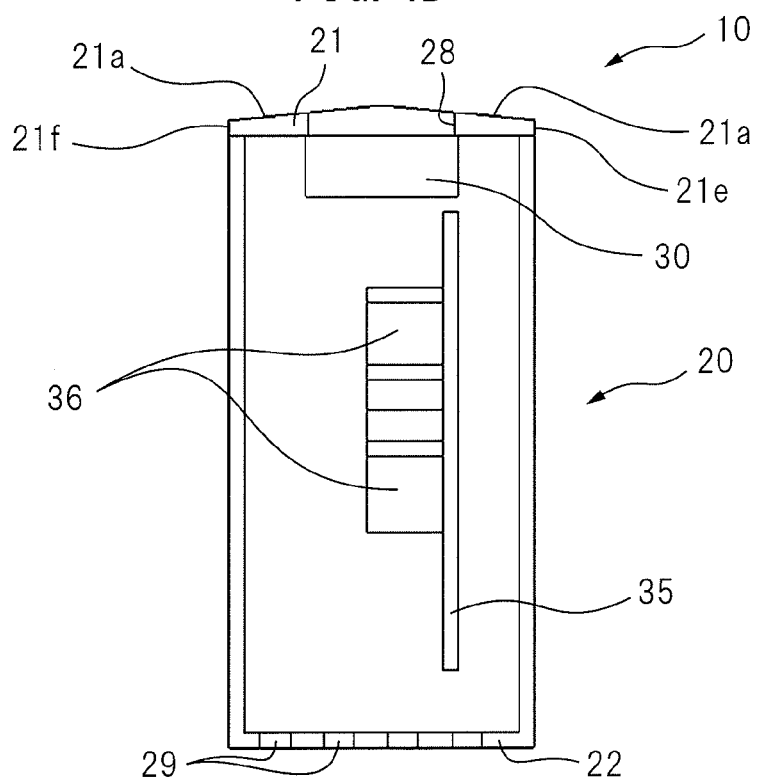
FIG. 4B is a side view of the motor driver illustrated in FIG. 4A.

FIG. 4A is a perspective view of a motor driver similar to the one illustrated in FIG. 1A, and FIG. 4B is a side view of the motor driver illustrated in FIG. 4A. In the configuration illustrated in FIGS. 4A and 4B, a top plate 21 is attachable to and detachable from the remaining part of a housing 20. In other words, the top plate 21 functions as a lid of the housing 20. In addition, as can be seen from FIG. 4B, each of edge portions 21e and 21f of the top plate 21 flushes with an outer surface of a corresponding side plate of the housing 20.

Moreover, FIG. 4C is a side view of a different motor driver according to the first embodiment of the present invention. In FIG. 4C, each of edge portions 21e and 21f of the top plate 21 protrudes sideward from the outer surface of the corresponding side plate of the housing 20. Furthermore, in FIG. 4D illustrating a modified example of the configuration illustrated in FIG. 4C, each of edge portions 21e and 21f of the top plate 21 protrudes sideward and then extends downward along the outer surface of the corresponding side plate of the housing 20.

In each of these configurations, the edge portions 21e and 21f of the top plate 21 protrude sideward from the respective outer surfaces of the side plates. Consequently, even if cutting fluid sprayed onto the wall 41 (see FIG. 1C) drops down to the motor driver 10, the cutting fluid is guided to the edge portions 21e and 21f of the top plate 21. In this way, the cutting fluid is prevented from flowing into the housing 20 from a gap between the top plate 21 and the remaining part of the housing 20. Thus, it is apparent that these configurations can provide an effect similar to that described above. By contrast, when the distance between the edge portions 21e and 21f of the top plate 21 is smaller than that between the outer surfaces of the respective side plates of the housing 20, cutting fluid may flow into the internal space of the housing 20 from a gap between the top plate 21 and the remaining surfaces of the housing 20.

Figure 5A:
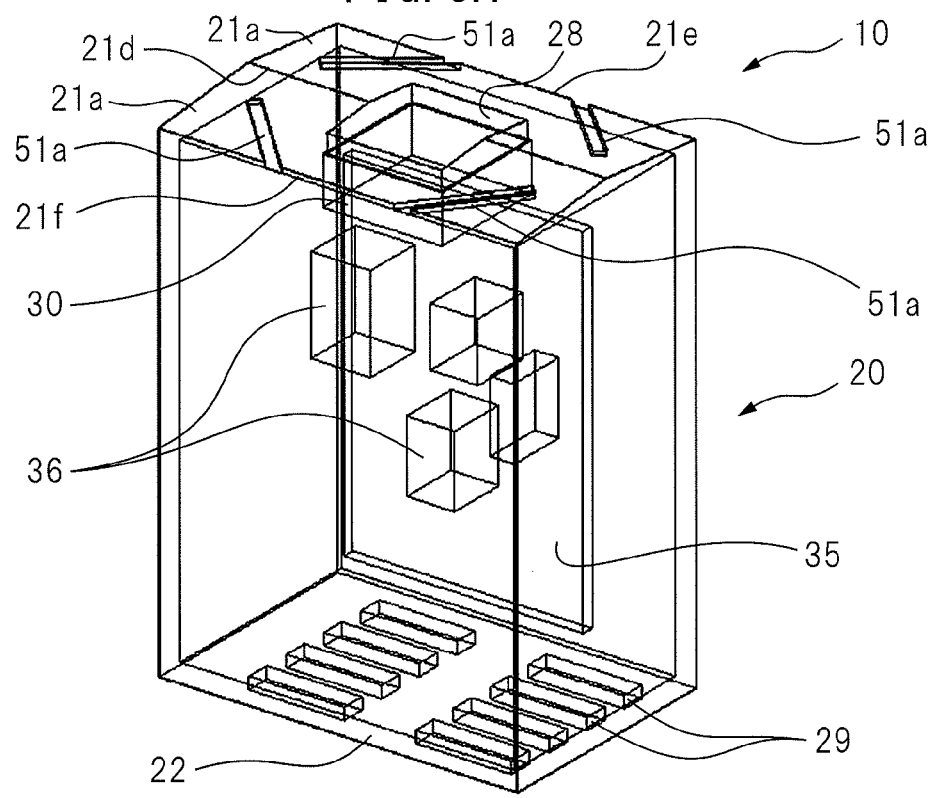
FIG. 5A is a perspective view of a still different motor driver according to the first embodiment of the present invention.
Figure 5B:
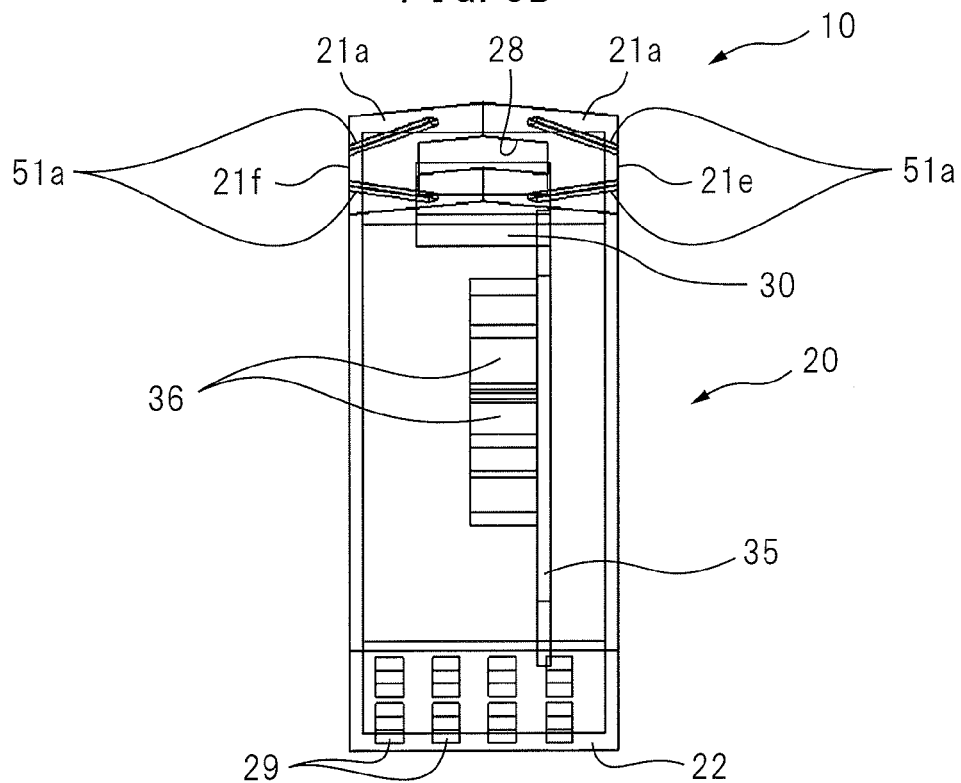
FIG. 5B is another perspective view of the motor driver illustrated in FIG. 5A.
Figure 6A:
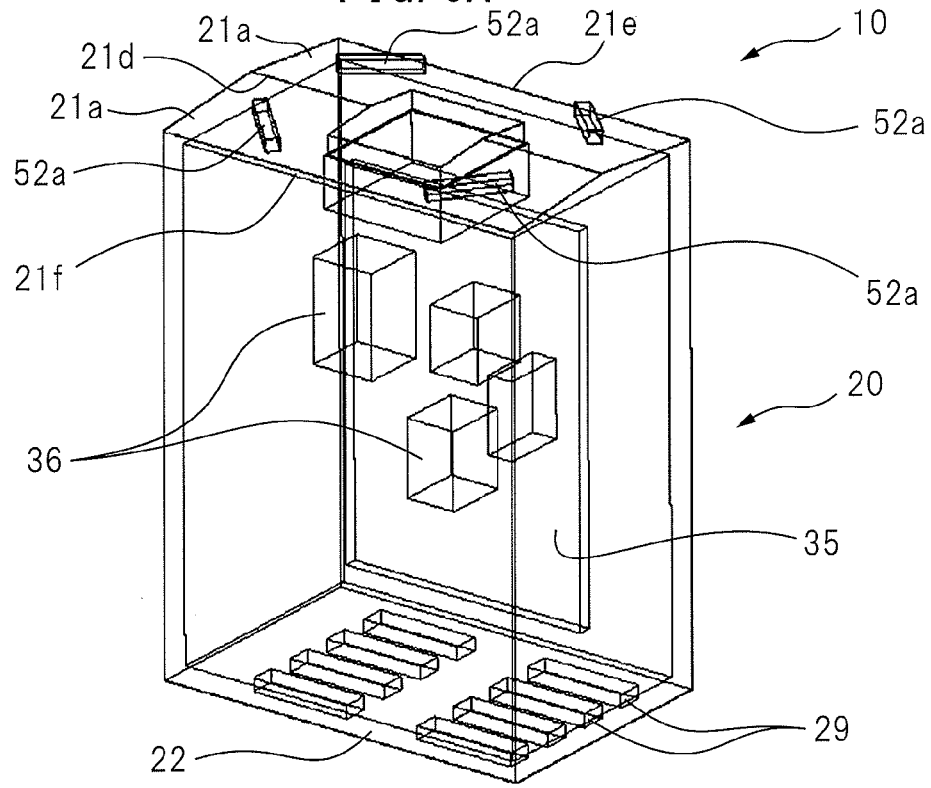
FIG. 6A is a perspective view of an additional motor driver according to the first embodiment of the present invention.
Figure 6B:
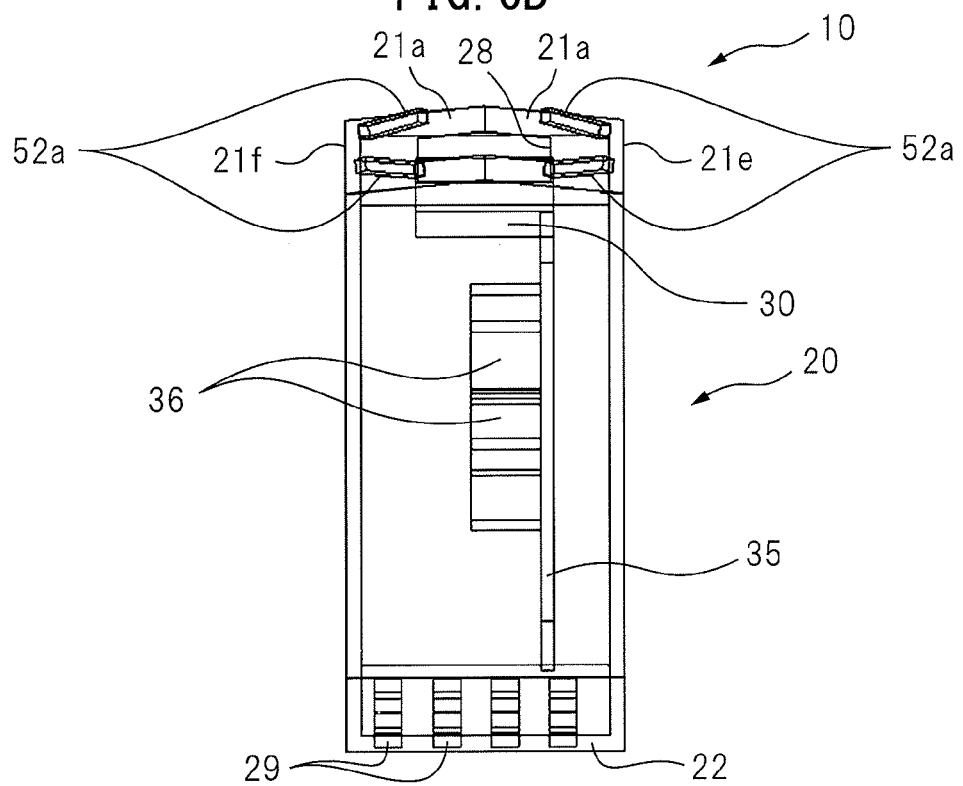
FIG. 6B is another perspective view of the motor driver illustrated in FIG. 6A.

FIG. 5A is a perspective view of a still different motor driver according to the first embodiment of the present invention, and FIG. 5B is another perspective view of the motor driver illustrated in FIG. 5A. In FIGS. 5A and 5B, two grooves 51a are formed in each of the two inclined surfaces 21a. Moreover, FIG. 6A is a perspective view of an additional motor driver according to the first embodiment of the present invention, and FIG. 6B is another perspective view of the motor driver illustrated in FIG. 6A. In FIGS. 6A and 6B, two protrusions 52a are formed on each of the two inclined surfaces 21a.

As can be seen from FIGS. 5A, 5B, 6A, and 6B, the grooves 51a and the protrusions 52a each extend from a middle area of the corresponding inclined surface 21a in an inclined direction with respect to the intersection line 21d, and end at the corresponding one of the edge portions 21e and 21f of the corresponding inclined surface 21a, the edge portions 21e and 21f being parallel with the intersection line 21d. In addition, the two grooves 51a and the two protrusions 52a of each of the inclined surfaces 21a extend in directions different from each other. However, the two grooves 51a and the two protrusions 52a of each of the inclined surfaces 21a may extend in parallel with each other.

In FIGS. 5A, 5B, 6A, and 6B, the grooves 51a or the protrusions 52a are formed in/on the inclined surfaces 21a of the top plate 21. Consequently, even if cutting fluid sprayed onto the wall 41 (see FIG. 1C) drops down to the motor driver 10, the cutting fluid is guided to the outer surfaces of the side plates of the housing 20, along the grooves 51a or the protrusions 52a. Thus, it is apparent that these configurations can provide an effect similar to that described above. Note that a case in which the inclined surfaces 21a, where the grooves 51a or the protrusions 52a are formed, are level surfaces is also within the scope of the present invention.

Figure 7A:
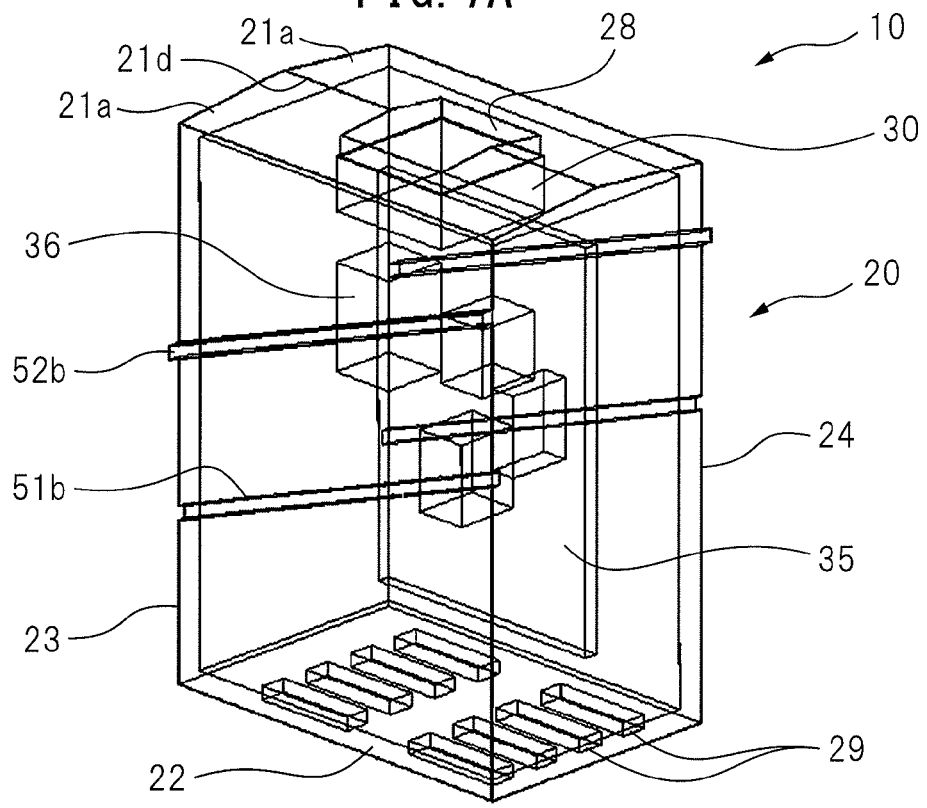
FIG. 7A is a perspective view of a still additional motor driver according to the first embodiment of the present invention.
Figure 7B:
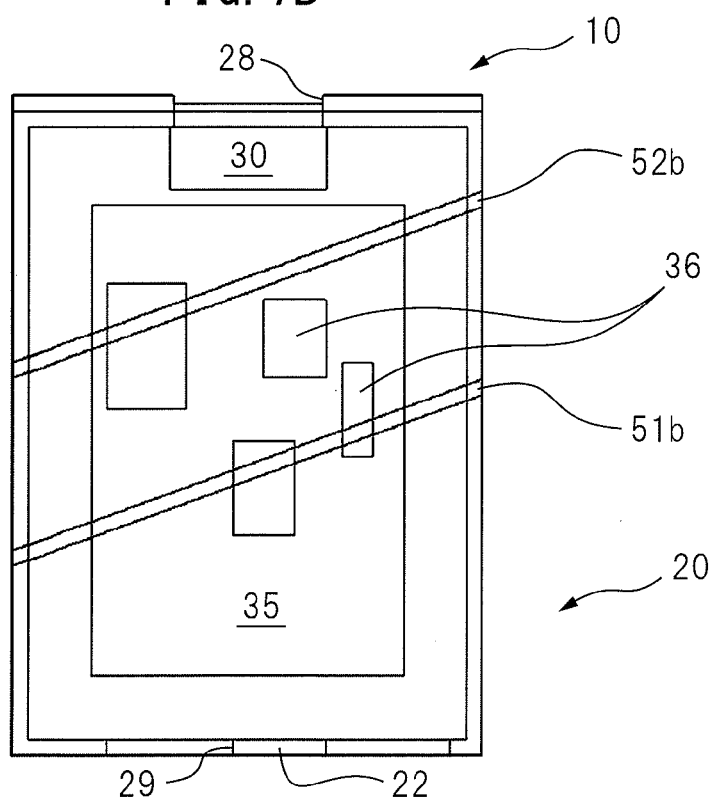
FIG. 7B is a side view of the motor driver illustrated in FIG. 7A.

FIG. 7A is a perspective view of a still additional motor driver according to the first embodiment of the present invention, and FIG. 7B is a side view of the motor driver illustrated in FIG. 7A. As illustrated in FIGS. 7A and 7B, a protrusion 52b and a groove 51b each extending in an oblique direction are formed on/in the outer surface of each of the two side plates 23 and 24 of the housing 20, the side plates 23 and 24 facing each other. Each of the side plates 23 and 24, where the protrusion 52b and the groove 51b are formed, is parallel with the intersection line 21d.

As can be seen from FIGS. 7A and 7B, each of the protrusion 52b and the groove 51b extends from one side-edge portion to the other side-edge portion of the outer surface of the corresponding one of the side plates 23 and 24. In the example illustrated in FIGS. 7A and 7B, the protrusion 52b and the groove 51b extend in parallel with each other. However, the protrusion 52b and the groove 51b need not be in parallel with each other as long as each extends in an oblique direction.

In this configuration, cutting fluid dropping down to the motor driver 10 is guided to the outer surfaces of the side plates 23 and 24 of the housing 20, along the inclined surfaces 21a. The cutting fluid thus guided is further guided to the side-edge portions of the outer surfaces of the side plates 23 and 24 by the protrusions 52b and/or the grooves 51b. With this configuration, it is apparent that the cutting fluid is collected at predetermined areas of the above-described side-edge portions, and consequently prevented from dropping down to other electronic components positioned in a lower part of the motor driver 10.

Figure 8A:
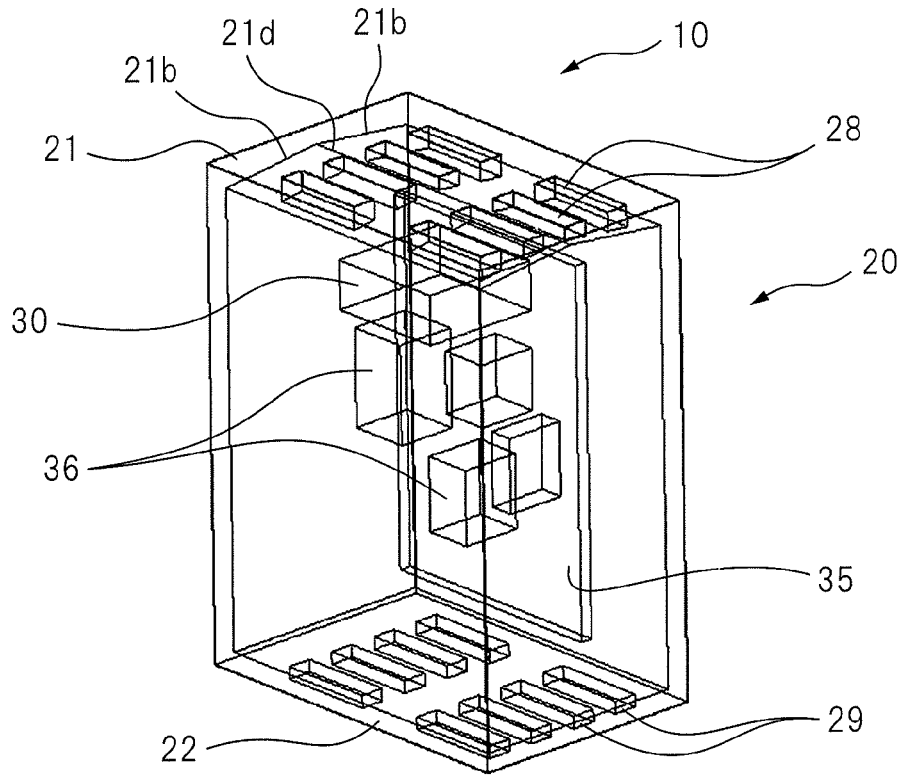
FIG. 8A is a perspective view of a motor driver according to a second embodiment of the present invention.
Figure 8B:
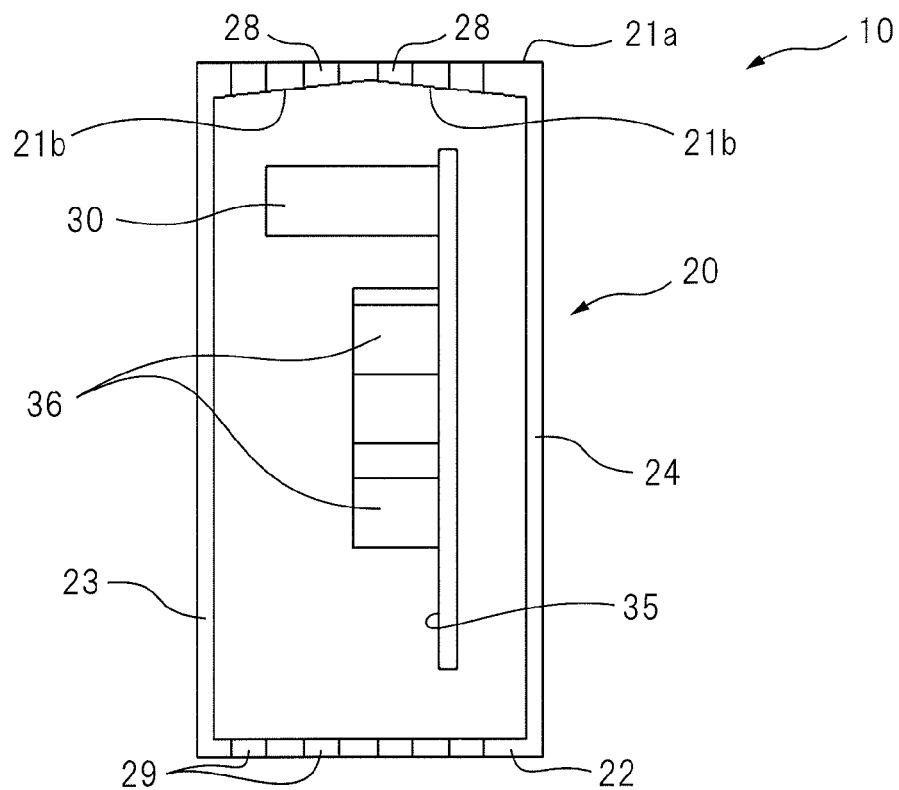
FIG. 8B is a side view of the motor driver illustrated in FIG. 8A.

FIG. 8A is a perspective view of a motor driver according to a second embodiment of the present invention, and FIG. 8B is a side view of the motor driver illustrated in FIG. 8A. In FIG. 8A and some other drawings, a plurality of through-holes 28 are formed in the top plate 21 of the housing 20. As can be seen from FIG. 8B and some other drawings, the fan motor 30 attached to the printed circuit board 35 is positioned below the through-holes 28. In other words, in the second embodiment, the fan motor 30 is arranged with a distance from the inner surface 21b of the top plate 21 of the housing 20.

In FIGS. 8A and 8B, the inner surface of the top plate 21 of the housing 20 is configured by two inclined surfaces 21b. As illustrated in FIG. 8B, each of the inclined surfaces 21b is inclined upward toward the center of the housing 20. Accordingly, a line 21d of intersection of the inclined surfaces 21b, which extends parallel with side plates 23 and 24 of the housing 20, is in a higher position than edge portions of the inner surface of the top plate 21.

Figure 8C:
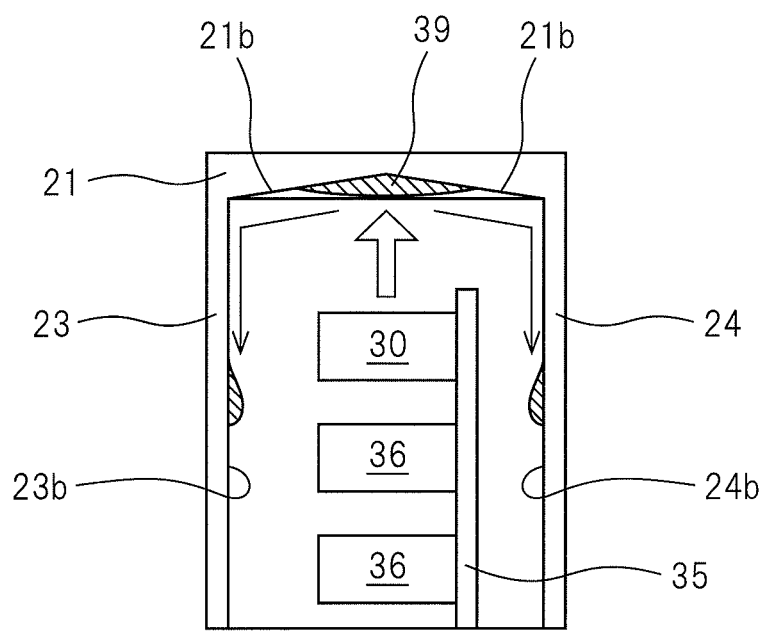
FIG. 8C is a schematic side view of part of the motor driver illustrated in FIG. 8A.

Moreover, FIG. 8C is a schematic side view of part of the motor driver illustrated in FIG. 8A. When the fan motor 30 is in operation, cutting fluid mist is sprayed onto the inner surface 21b of the top plate 21, as indicated by a white arrow in FIG. 8C, and then accumulated as a fluid pool 39. When the fluid pool 39 reaches a certain volume, the cutting fluid drops down under its own weight as indicated by solid-line arrows.

In some examples of the second embodiment, the inclined surfaces 21b are used as the inner surface of the top plate 21. Accordingly, the cutting fluid sprayed onto the inner surface of the top plate 21 of the motor driver 10 is guided to inner surfaces 23b and 24b of the side plates 23 and 24 of the housing 20, along the inclined surfaces 21b. With this configuration, the cutting fluid does not adhere to the electronic components 36 in the motor driver 10. Hence, this configuration can prevent a breakdown of the electronic components 36 in the motor driver 10, due to the cutting fluid.

Figure 9A:
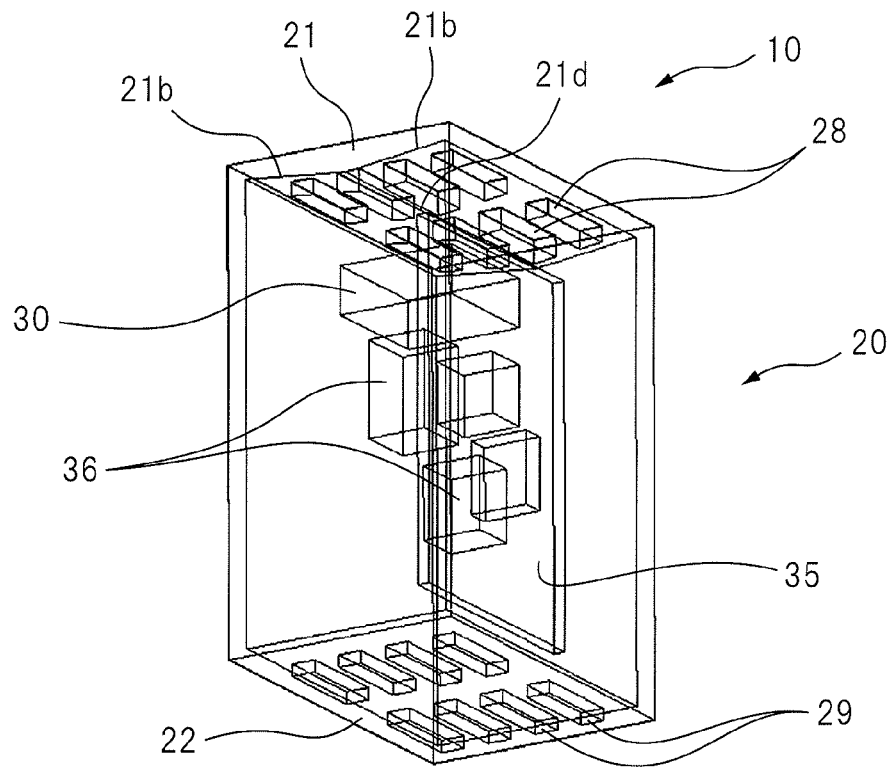
FIG. 9A is a perspective view of another motor driver according to the second embodiment of the present invention.
Figure 9B:
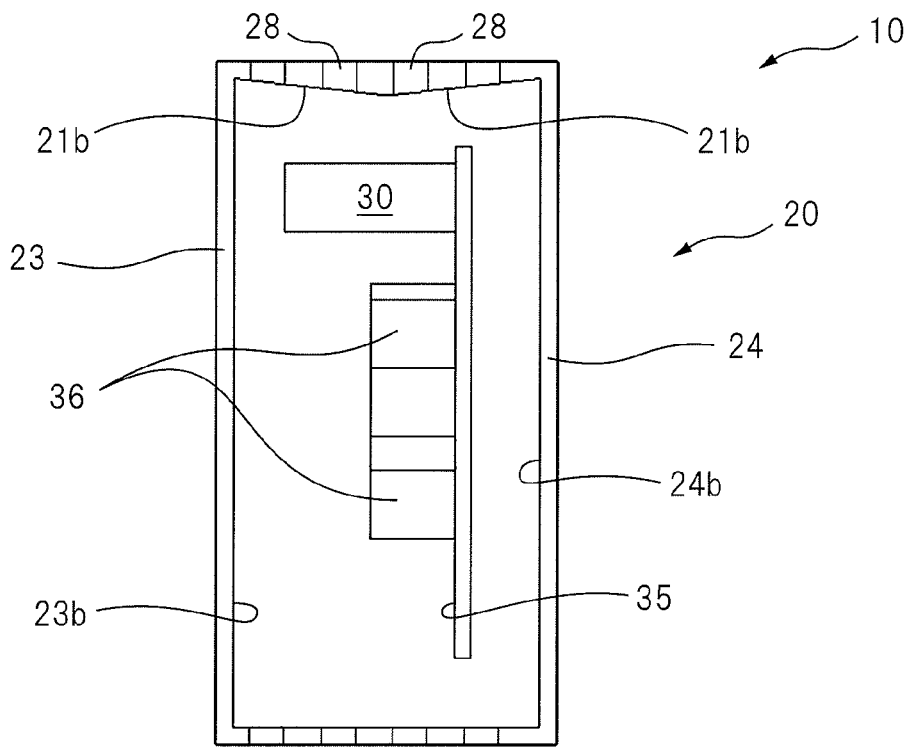
FIG. 9B is a side view of the motor driver illustrated in FIG. 9A.

FIG. 9A is a perspective view of another motor driver according to the second embodiment of the present invention, and FIG. 9B is a side view of the motor driver illustrated in FIG. 9A. In FIGS. 9A and 9B, each of two inclined surfaces 21b constituting the inner surface of the top plate 21 of the housing 20 is inclined downward toward the center of the housing 20. Accordingly, the line 21d of intersection of the inclined surfaces 21b, which extends in parallel with the side plates 23 and 24 of the housing 20, is in a lower position than the edge portions of the inner surface of the top plate 21.

In this configuration, cutting fluid mist sprayed onto the inner surface 21b of the top plate 21 is guided to an area near the intersection line 21d on the top plate 21 of the housing 20, along the inclined surfaces 21b. Consequently, the cutting fluid is not collected near the inner surfaces 23b and 24b of the side plates 23 and 24 of the housing 20, preventing the cutting fluid from adhering to the electronic components 36 positioned near the inner surfaces 23b and 24b of the side plates 23 and 24. Thus, this configuration can prevent a breakdown of the electronic components 36 in the motor driver 10, due to the cutting fluid. Naturally, the two inclined surfaces 21b may be designed to differ in size so that the intersection line 21d would be in a position apart from the electronic components 36.

Figure 10A:
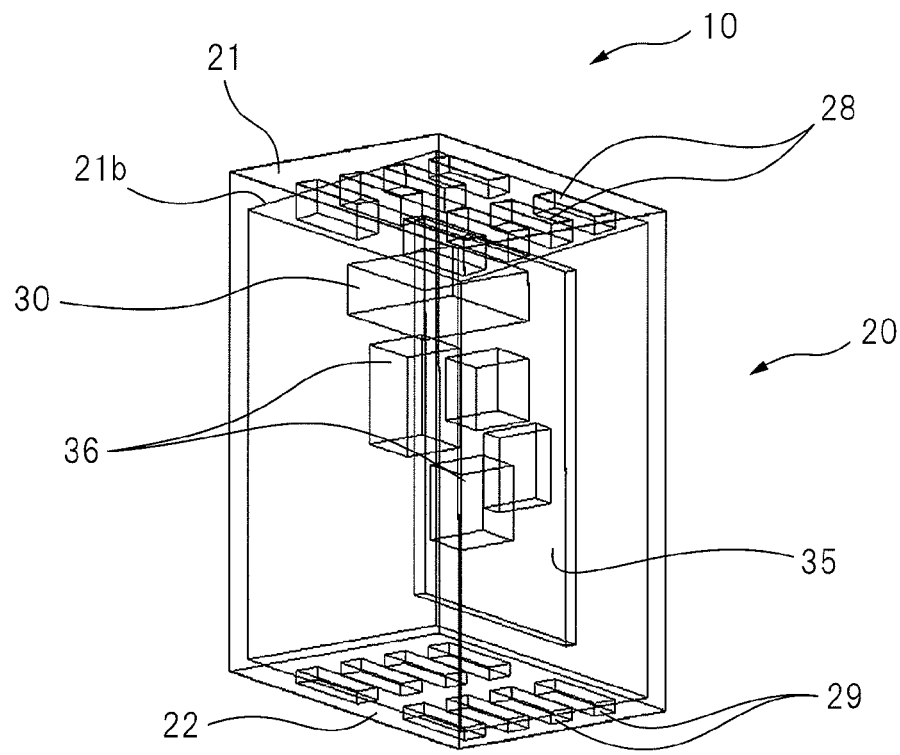
FIG. 10A is a perspective view of still another motor driver according to the second embodiment of the present invention.
Figure 10B:
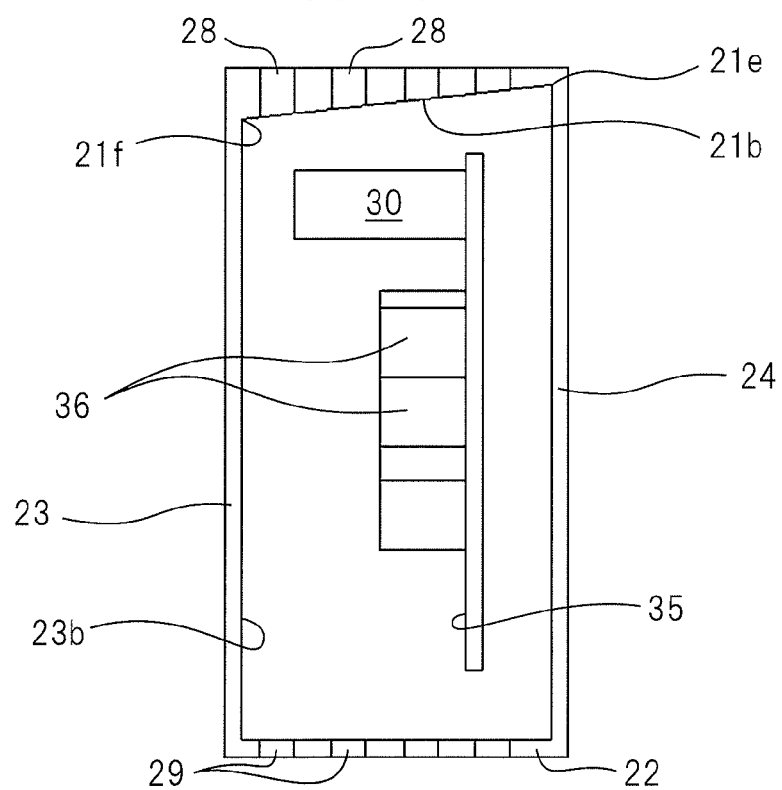
FIG. 10B is a side view of the motor driver illustrated in FIG. 10A.

FIG. 10A is a perspective view of still another motor driver according to the second embodiment of the present invention, and FIG. 10B is a side view of the motor driver illustrated in FIG. 10A. In FIGS. 10A and 10B, the inner surface of the top plate 21 of the housing 20 is configured by a single inclined surface 21b. As can be seen from FIGS. 10A and 10B, an edge portion 21e of the single inclined surface 21b is in a higher position than an opposite edge portion 21f of the inclined surface 21b.

In this configuration, cutting fluid mist sprayed onto the inner surface 21b of the top plate 21 is guided to the inner surface 23b of the one side plate 23 of the housing 20 with respect to the top plate 21, along the inclined surface 21b. Consequently, the cutting fluid is prevented from adhering to the electronic components 36 in the housing 20. Thus, it is apparent that this configuration can provide an effect similar to that described above.

Figure 11A:
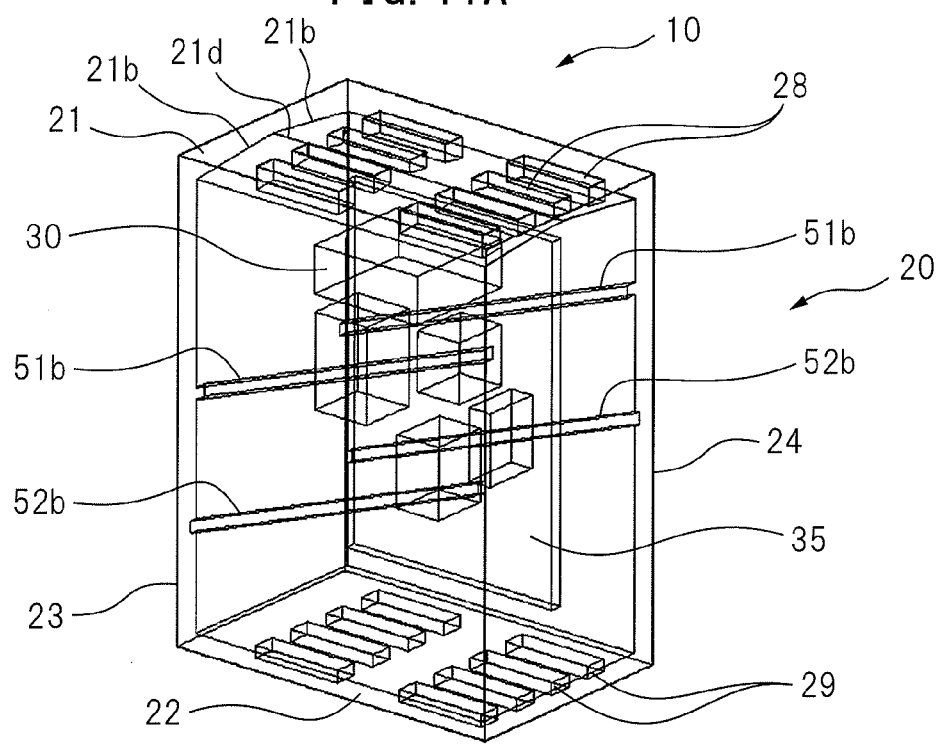
FIG. 11A is a perspective view of a different motor driver according to the second embodiment of the present invention.
Figure 11B:
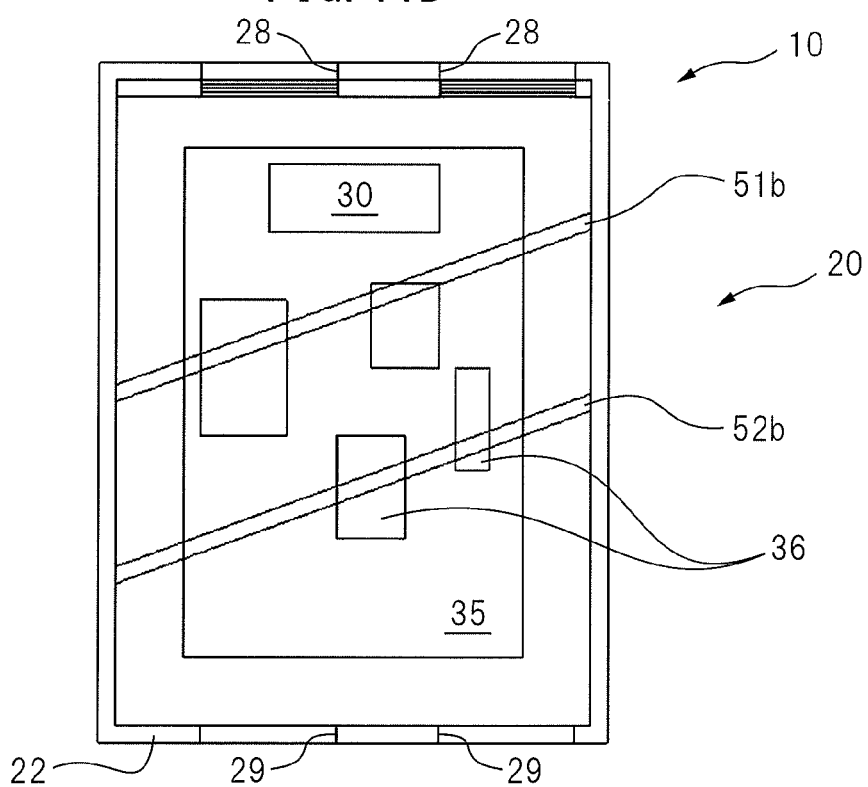
FIG. 11B is a side view of the motor driver illustrated in FIG. 11A.

FIG. 11A is a perspective view of a different motor driver according to the second embodiment of the present invention, and FIG. 11B is a side view of the motor driver illustrated in FIG. 11A. As illustrated in FIGS. 11A and 11B, a protrusion 52b and a groove 51b each extending in an oblique direction are formed on/in the inner surface of each of the two side plates 23 and 24 of the housing 20, the two side plates 23 and 24 facing each other. The side plates 23 and 24, where the protrusions 52b and the grooves 51b are formed, are in parallel with the intersection line 21d.

As can be seen from FIGS. 11A and 11B, each of the protrusion 52b and the groove 51b extends from one side-edge portion to the other side-edge portion of the inner surface of the corresponding one of the side plates 23 and 24. In the example illustrated in FIGS. 11A and 11B, the protrusion 52b and the groove 51b extend in parallel with each other. However, the protrusion 52b and the groove 51b need not be in parallel with each other, as long as each extend in an oblique direction.

In this configuration, cutting fluid sprayed onto the inner surface 21b of the top plate 21 is guided to the inner surfaces 23b and 24b of the side plates 23 and 24 of the housing 20, along the inclined surfaces 21b. The cutting fluid thus guided is further guided to the side-edge portions of the inner surfaces 23b and 24b of the side plates 23 and 24 by the protrusions 52b and/or the grooves 51b. With this configuration, it is apparent that the cutting fluid is collected at predetermined areas of the above-described side-edge portions, and consequently prevented from dropping down to other electronic components positioned in a lower part of the motor driver 10.

Figure 12A:
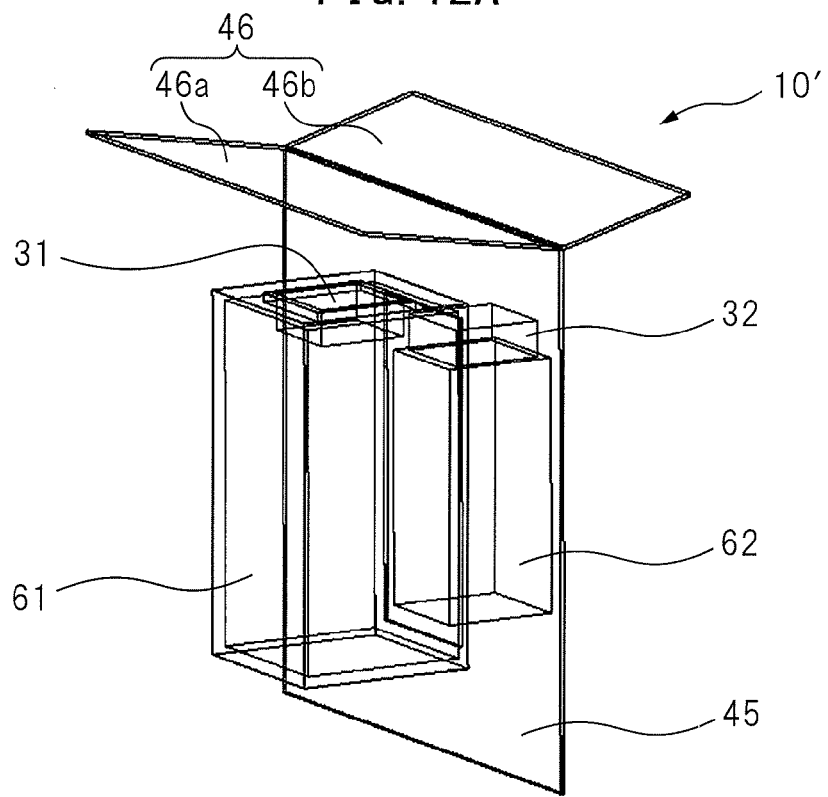
FIG. 12A is a perspective view of a cabinet according to the present invention.
Figure 12B:
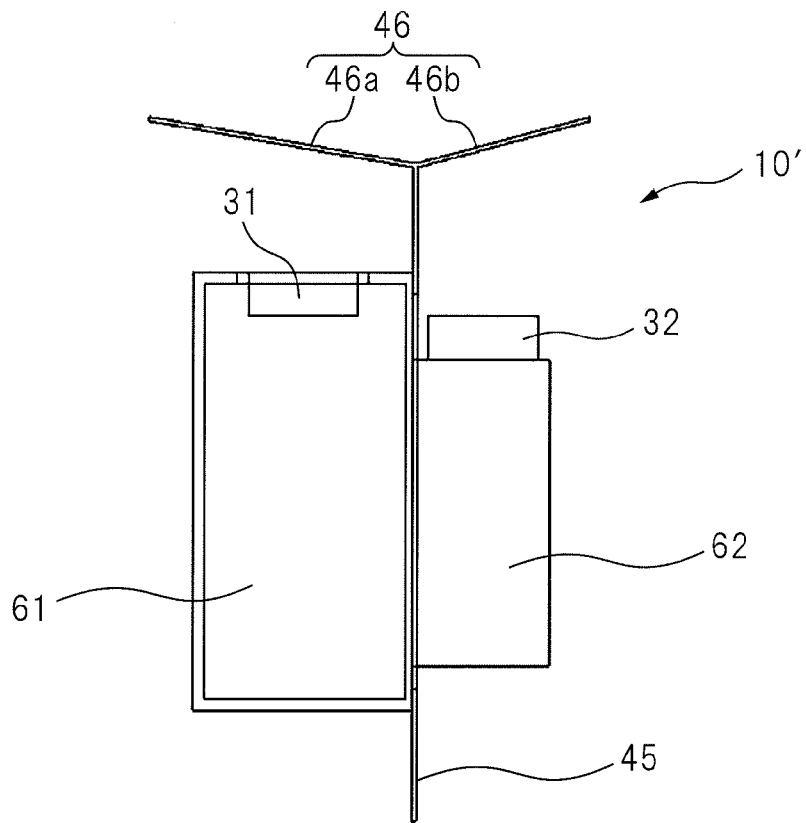
FIG. 12B is a side view of the cabinet illustrated in FIG. 12A.

FIG. 12A is a perspective view of a cabinet according to the present invention, and FIG. 12B is a side view of the cabinet illustrated in FIG. 12A. As illustrated in FIGS. 12A and 12B, a cabinet 10' is provided with electronic equipment 61 including electronic components for driving or controlling a motor for a machine tool or an industrial robot, and a radiator 62, such as a heat sink. The cabinet 10' includes a first wall 45 extending vertically. The electronic equipment 61 is attached to one surface of the first wall 45, and the radiator 62 is attached to the other surface of the first wall 45. In a precise sense, an opening (not illustrated) is formed in the first wall 45, and the radiator 62 is attached directly to the electronic equipment 61 through the opening of the first wall 45. Note that the cabinet 10' may include only the electronic equipment 61, or may include a combination of the electronic equipment 61 and one or more of the radiator 62, a first fan motor 31, and a second fan motor 32.

In some cases, the first fan motor 31 is attached to an upper end of the electronic equipment 61, and the second fan motor 32 is attached to an upper end of the radiator 62. The first fan motor 31 and the second fan motor 32 have a function of appropriately discharging heat from the electronic equipment 61 and the radiator 62, respectively.

Figure 12C:
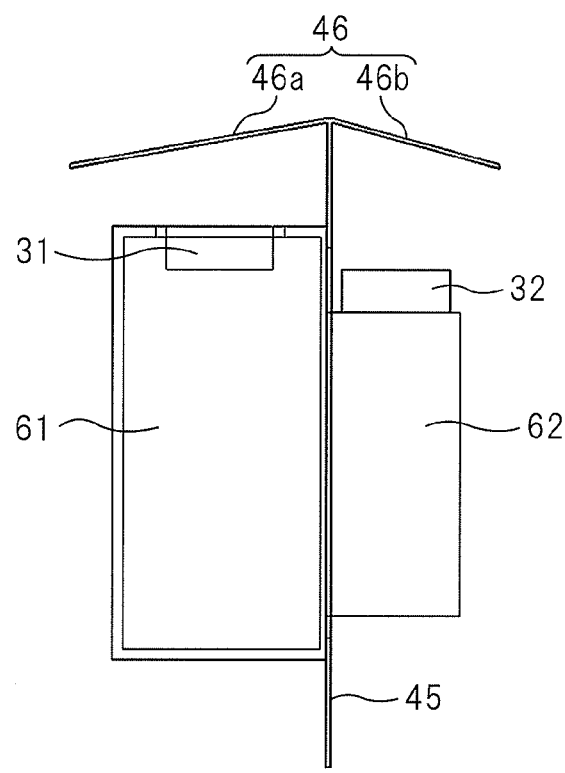
FIG. 12C is a side view of a cabinet similar to the one illustrated in FIG. 12A.

Moreover, as illustrated in FIGS. 12A, 12b, and 12C, a second wall 46 extending laterally with respect to the first wall 45 is attached to an upper end of the first wall 45. In FIGS. 12A, 12B, and 12C, the second wall 46 is configured by two partial walls 46a and 46b. The two partial walls 46a and 46b are inclined so as to abut on the first wall 45.

Figure 12D:
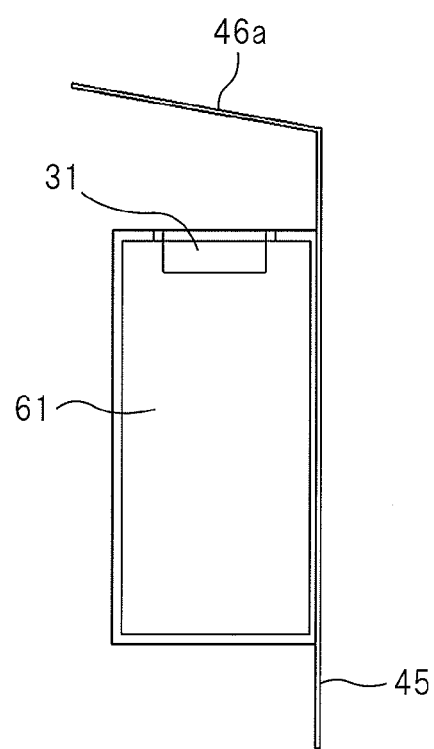
FIG. 12D is a side view of another cabinet similar to the one illustrated in FIG. 12A.

FIG. 12D is a schematic view illustrating a case in which the cabinet 10' is configured by the electronic equipment 61 and the first fan motor 31. As illustrated in FIG. 12D, the second wall 46 may be configured only by a single partial wall 46a.

Figure 13B:
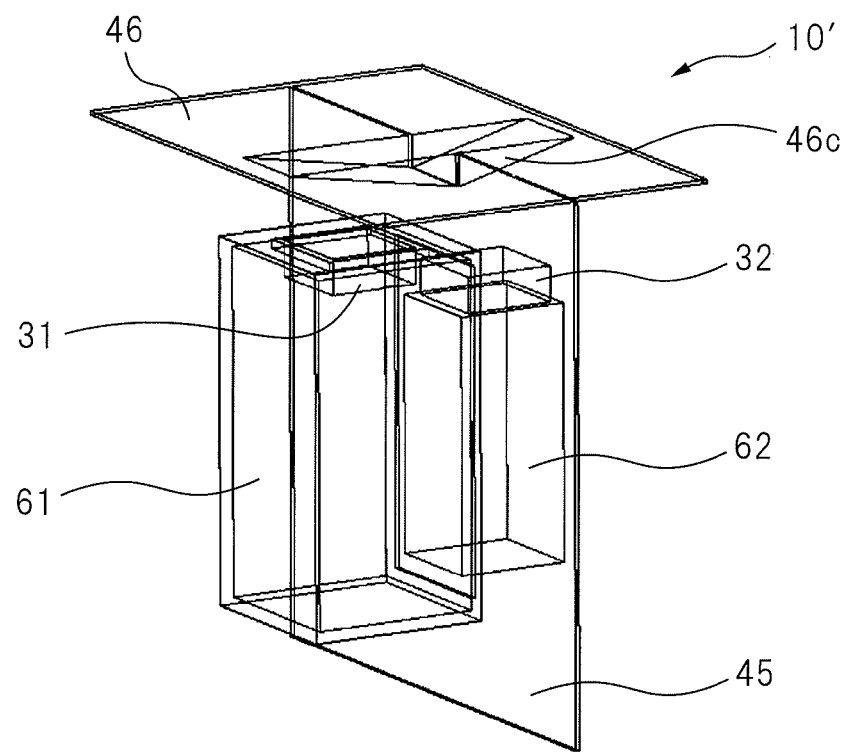
FIG. 13B is a perspective view of the cabinet illustrated in FIG. 13A.
Figure 13C:
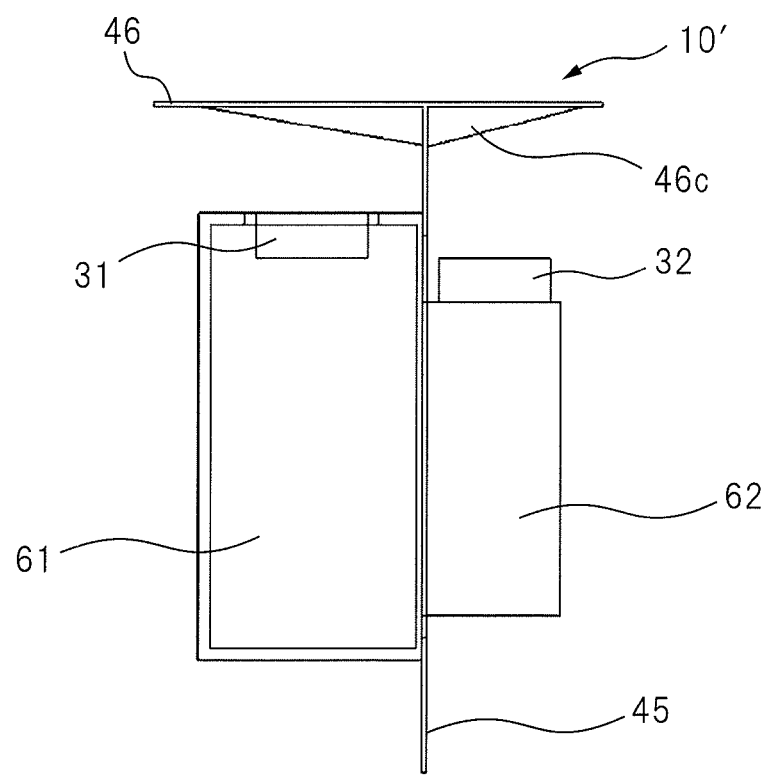
FIG. 13C is a side view of the cabinet illustrated in FIG. 13A.

FIG. 13A is a schematic side view of part of another cabinet according to the present invention. Moreover, FIG. 13B is a perspective view of the cabinet illustrated in FIG. 13A, and FIG. 13C is a side view of the cabinet illustrated in FIG. 13A. In FIGS. 13A to 13C, a second wall 46 is flat and extends horizontally. To a bottom surface of the second wall 46, a bulge 46c having a substantially triangular cross section is attached. As illustrated in FIGS. 13A to 13C, it is assumed that a first wall 45 is attached to a tip of the bulge 46c.

The bulge 46c has a function similar to that of the inner surfaces of the partial walls 46a and 46b illustrated in FIGS. 12A and 12B. As can be seen from FIG. 13B, it is preferable that the width of the bulge 46c in a direction of a line of intersection of the first wall 45 and the second wall 46 be greater than the width of each of the first fan motor 31 and the second fan motor 32 in the above-described direction of the intersection line.

When the first fan motor 31 and the second fan motor 32 are in operation, cutting fluid mist comes into each of the electronic equipment 61 and the radiator 62, and is then discharged from the electronic equipment 61 and the radiator 62, as indicated by white arrows in FIG. 13A. The cutting fluid mist thus discharged is sprayed onto the second wall 46, and accumulated as fluid pools 39. When each of the fluid pools 39 reaches a certain volume, the cutting fluid drops down under its own weight.

In FIGS. 12A to 12C and FIGS. 13A to 13C, the second wall 46 is configured by the two partial walls 46a and 46b each inclined downward, or is provided with the bulge 46c on the one surface. With these configurations, the cutting fluid is guided to the one surface 45a and the other surface 45b of the first wall 45, along the two partial walls 46a and 46b or the bulge 46c. Accordingly, the cutting fluid does not adhere to the electronic equipment 61 of the cabinet 10', preventing a breakdown of the electronic equipment 61 of the cabinet 10', due to the cutting fluid.

Figure 14A:
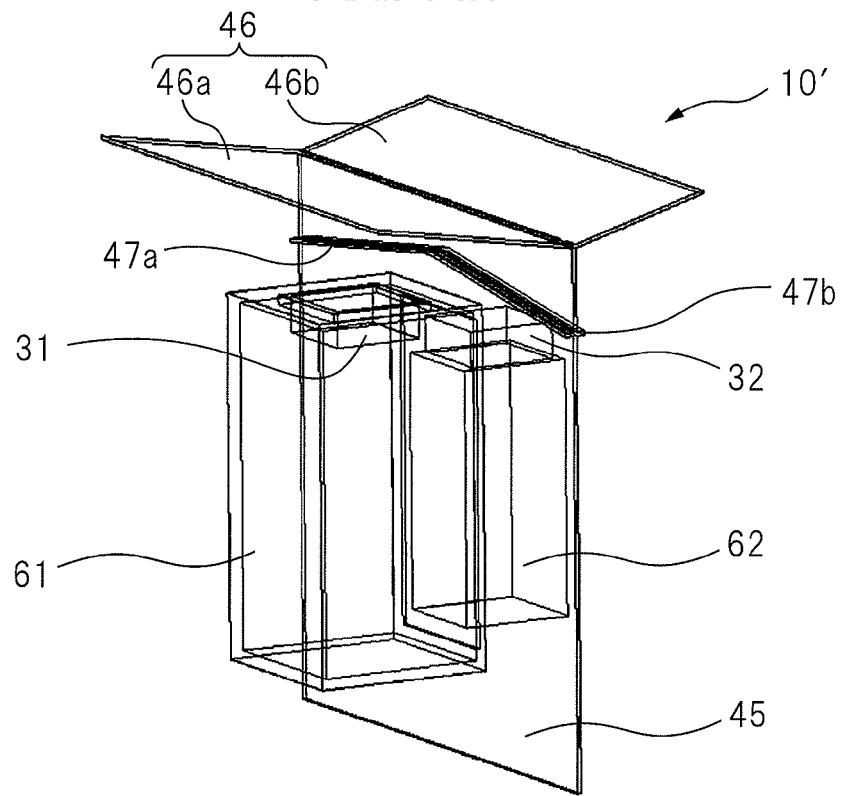
FIG. 14A is a perspective view of another cabinet according to the present invention.
Figure 14B:
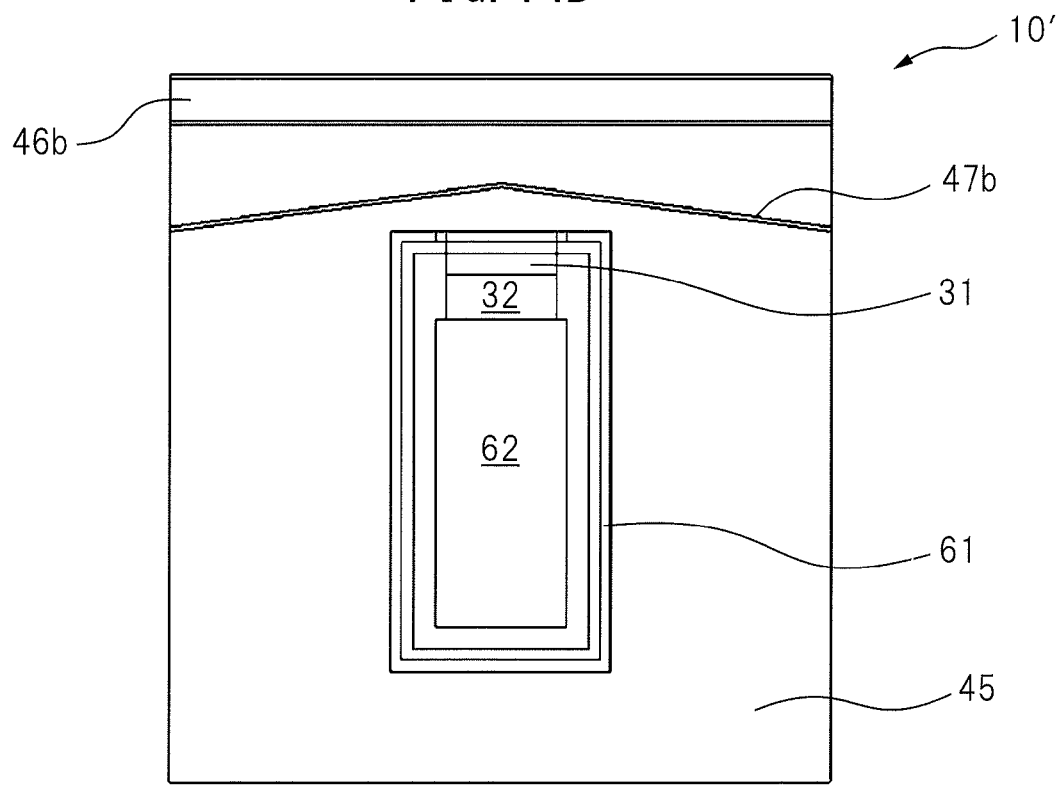
FIG. 14B is a back view of the cabinet illustrated in FIG. 14A.

FIG. 14A is a perspective view of another cabinet according to the present invention, and FIG. 14B is a back view of the cabinet illustrated in FIG. 14A. In FIGS. 14A and 14B, inverted V-shaped protrusions 47a and 47b are attached to respective surfaces of the first wall 45. As illustrated in FIGS. 14A and 14B, the inverted V-shaped protrusion 47a is positioned between the first fan motor 31 and the partial wall 46a, while the inverted V-shaped protrusion 47b is positioned between the second fan motor 32 and the partial wall 46b.

As can be seen from FIGS. 14A and 14B, the vertex of each of the inverted V-shaped protrusions 47a and 47b is positioned above the corresponding one of the first fan motor 31 and the second fan motor 32. Consequently, cutting fluid guided to the first wall 45 along the partial walls 46a and 46b or the bulge 46c is further guided by the inverted V-shaped protrusions 47a and 47b away from the electronic equipment 61 and the radiator 62. This configuration can further prevent the cutting fluid from adhering to the electronic equipment 61 and the radiator 62. In addition, the cutting fluid is guided to predetermined areas, preventing the cutting fluid from dropping down to other electronic components. To provide this effect, it is preferable that the length of each of the inverted V-shaped protrusions 47a and 47b in the direction of the line of intersection of the first wall 45 and the second wall 46 be greater than the length of each of the electronic equipment 61 and the radiator 62 in the above-described direction of the intersection line.

Figure 15A:
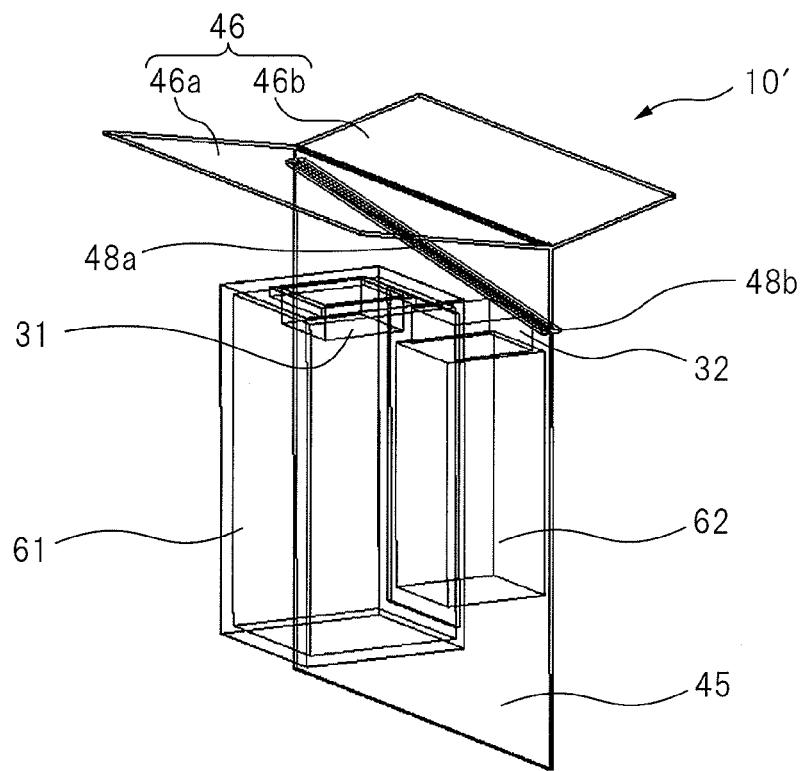
FIG. 15A is a perspective view of still another cabinet according to the present invention.
Figure 15B:
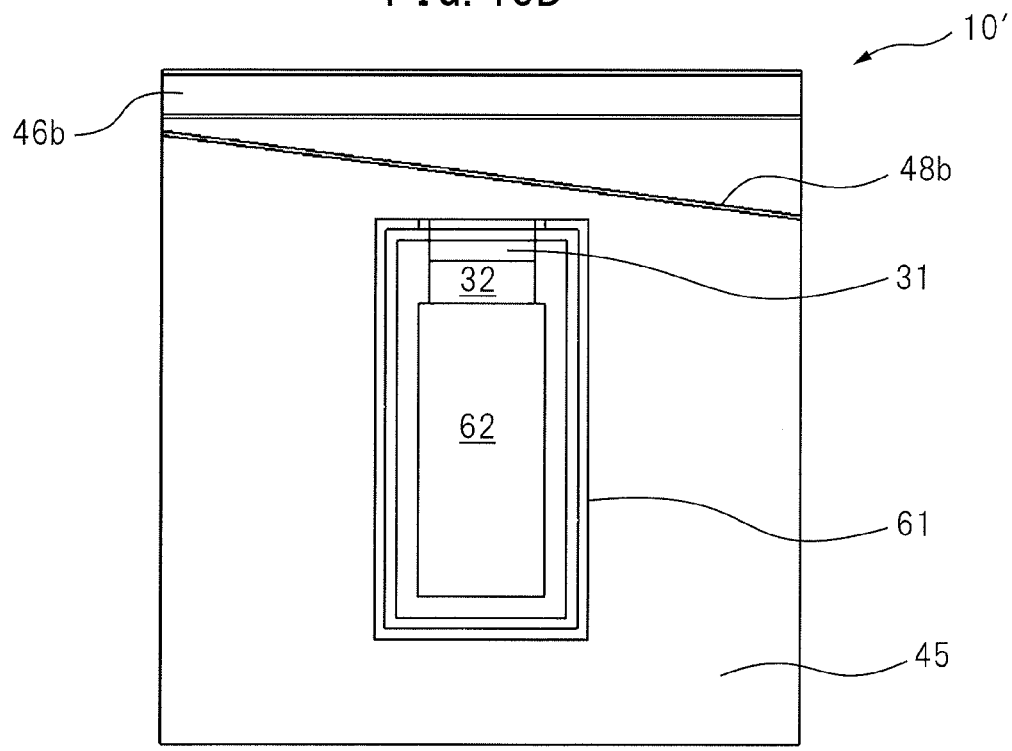
FIG. 15B is a back view of the cabinet illustrated in FIG. 15A.

FIG. 15A is a perspective view of still another cabinet according to the present invention, and FIG. 15B is a back view of the cabinet illustrated in FIG. 15A. In FIGS. 15A and 15B, elongated protrusions 48a and 48b are attached to the respective surfaces of the first wall 45. As illustrated in FIGS. 15A and 15B, the elongated protrusion 48a is positioned between the first fan motor 31 and the partial wall 46a, while the elongated protrusion 48b is positioned between the second fan motor 32 and the partial wall 46b.

The cutting fluid guided to the first wall 45 along the partial walls 46a and 46b or the bulge 46c is further guided by the elongated protrusions 48a and 48b so as to be away from the electronic equipment 61 and the radiator 62. This configuration can further prevent the cutting fluid from adhering to the electronic equipment 61 and the radiator 62. In addition, the cutting fluid is guided to predetermined areas, preventing the cutting fluid from dropping to other electronic components. To provide this effect, it is preferable that the length of each of the elongated protrusions 48a and 48b in the direction of the line of intersection of the first wall 45 and the second wall 46 be greater than the length of each of the electronic equipment 61 and the radiator 62 in the above-described direction of the intersection line.

Figure 16A:
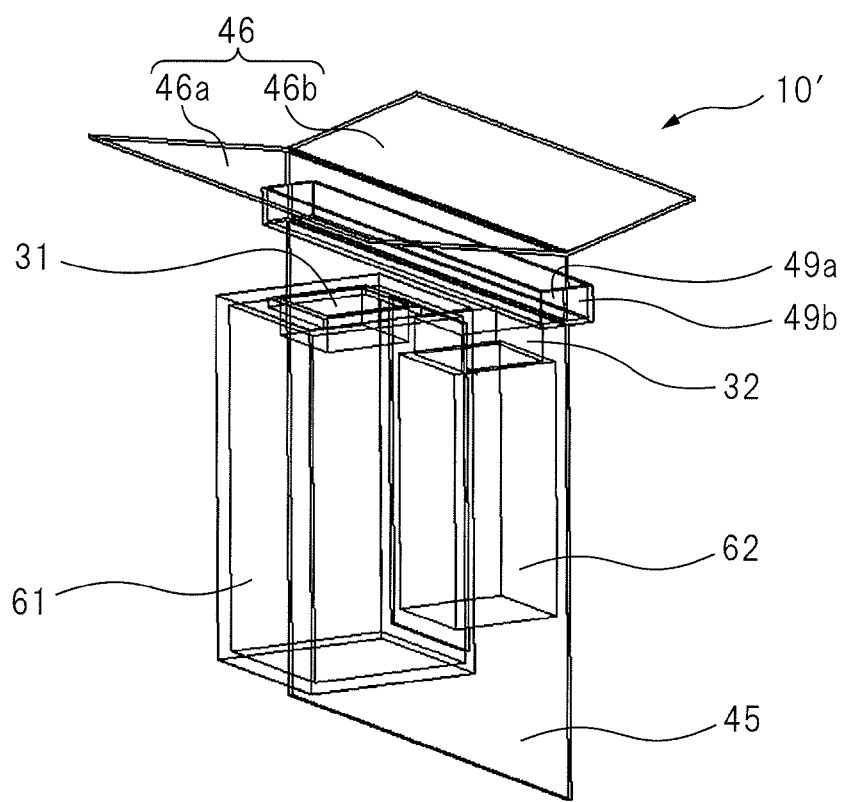
FIG. 16A is a perspective view of a different cabinet according to the present invention.
Figure 16B:
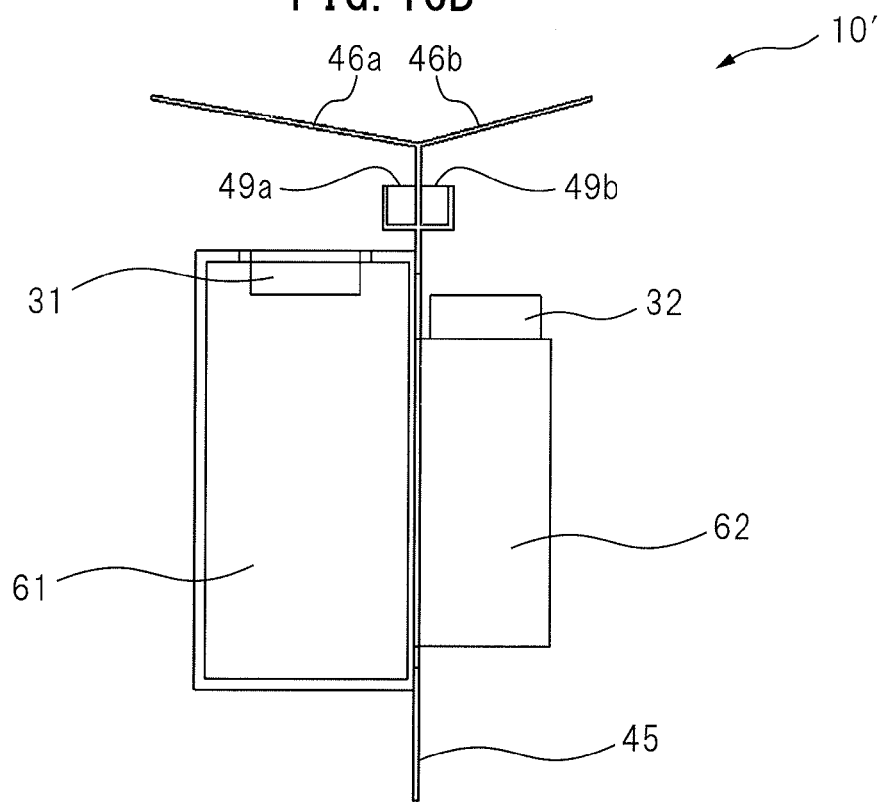
FIG. 16B is a side view of the cabinet illustrated in FIG. 16A.

FIG. 16A is a perspective view of a different cabinet according to the present invention, and FIG. 16B is a side view of the cabinet illustrated in FIG. 16A. In FIGS. 16A and 16B, receiving parts 49a and 49b each having a substantially U-shaped cross section are attached to the respective surfaces of the first wall 45. As illustrated in FIGS. 16A and 16B, the receiving part 49a is positioned between the first fan motor 31 and the partial wall 46a, while the receiving part 49b is positioned between the second fan motor 32 and the partial wall 46b.

The cutting fluid guided to the first wall 45 along the partial walls 46a and 46b or the bulge 46c is received by the receiving parts 49a and 49b. With this configuration, the cutting fluid is prevented from adhering to the electronic equipment 61 and the radiator 62, further preventing a breakdown of the electronic equipment 61. To provide this effect, it is preferable that the length of each of the receiving parts 49a and 49b in the direction of the line of intersection of the first wall 45 and the second wall 46 be greater than the length of each of the electronic equipment 61 and the radiator 62 in the above-described direction of the intersection line.

In addition, it is preferable that the cutting fluid accumulated in the receiving parts 49a and 49b be discharged from the receiving parts 49a and 49b regularly. For this reason, the receiving parts 49a and 49b may be inclined as the elongated protrusions 48a and 48b. Note that appropriately combining the examples described above is within the scope of the invention.

Effect of the Invention

In the first to sixth aspects, the outer surface of the top plate is configured by an inclined surface or inclined surfaces. Accordingly, even if cutting fluid sprayed onto the wall positioned above the motor driver drops down to the motor driver, the cutting fluid is guided to the outer surfaces of the side plates of the housing, along the inclined surface (s). As a result, the cutting fluid does not flow into the motor driver, preventing a breakdown of the electronic components in the motor driver, due to the cutting fluid.

In the seventh to eleventh aspects, the inner surface of the top plate is configured by an inclined surface or inclined surfaces. Accordingly, cutting fluid sprayed onto the inner surface of the top plate of the motor driver is guided to the inner surfaces of the side plates of the housing, along the inclined surface(s). As a result, the cutting fluid does not adhere to the electronic components in the motor driver, preventing a breakdown of the electronic components in the motor driver, due to the cutting fluid.

In the twelfth to fifteenth aspects, a bulge is provided to the one surface of the second wall. Accordingly, the cutting fluid sprayed onto the one surface of the second wall is guided to the first wall, along the bulge. As a result, the cutting fluid does not drop down to the electronic components, preventing a breakdown of the electronic components mounted on the cabinet, due to the cutting fluid.

The present invention has been described above on the basis of the representative embodiments. However, it should be apparent to those skilled in the art that the above-described modifications as well as various other modifications, omissions, and additions can be made without departing from the spirit of the present invention.

What is claimed is:

1. A motor driver, comprising:
a housing having a top plate and a bottom plate, wherein the top plate includes
an outer surface which includes two inclined surfaces extending from two opposite edges of the top plate to meet at an intersection line that is not in alignment with the edges,
a horizontal inner surface opposite to the outer surface, and
a through hole extending through the top plate from the inner surface to the outer surface;
an electronic component disposed inside the housing, and configured to drive or control a motor; and
a fan motor disposed below the top plate of the housing, attached to the horizontal inner surface of the top plate, and configured to cause air to pass from an opening in the bottom plate of the housing to the through hole in the top plate of the housing, wherein
the intersection line of the two inclined surfaces is in a higher or lower position than the two opposite edges of the top plate, the two opposite edges being away from the line of intersection,
the fan motor is attached to the horizontal inner surface of the top plate at a position corresponding to the intersection line, so as to be adjacent to the through hole of the top plate, and
the horizontal inner surface of the top plate is flat.

2. The motor driver according to claim 1, wherein the intersection line is in a higher position than the two opposite edges of the top plate.

3. The motor driver according to claim 1, wherein the intersection line is in a lower position than the two opposite edges of the top plate.

4. The motor driver according to claim 1, wherein one of the two opposite edges of the top plate is in a higher position than the other.

5. The motor driver according to claim 1, wherein the top plate of the housing protrudes laterally so as to be longer than a width of a rest of the housing.

6. The motor driver according to claim 1, wherein at least one of a groove and an elongated protrusion is provided in at least one of the outer surface of the top plate of the housing and an outer surface of a side plate of the housing.

7. A motor driver, comprising:
a housing having a top plate and a bottom plate, wherein the top plate includes
an outer surface which includes two inclined surfaces extending from two opposite edges of the top plate to meet at an intersection line that is not in alignment with the edges,
a horizontal inner surface opposite to the outer surface, and
a through hole extending through the top plate from the inner surface to the outer surface;
an electronic component disposed inside the housing, and configured to drive or control a motor; and
a fan motor disposed below the top plate of the housing, attached to the horizontal inner surface of the top plate, and configured to cause air to pass from an opening in the bottom plate of the housing to the through hole in the top plate of the housing, wherein
the intersection line of the two inclined surfaces is in a higher position than the two opposite edges of the top plate, the two opposite edges being away from the line of intersection,
the fan motor is attached to the horizontal inner surface of the top plate at a position corresponding to the intersection line, so as to be adjacent to the through hole of the top plate,
the horizontal inner surface of the top plate is flat, and the top plate has four straight edges, and each of the two opposite edges is one of said four straight edges.

8. The motor driver according to claim 7, wherein the top plate of the housing protrudes laterally so as to be longer than a width of a rest of the housing.

9. The motor driver according to claim 7, wherein at least one of a groove and an elongated protrusion is provided in at least one of the outer surface of the top plate of the housing and an outer surface of a side plate of the housing.

* * * * *